US012658863B2

(12) United States Patent
Bryant

(10) Patent No.: US 12,658,863 B2
(45) Date of Patent: Jun. 16, 2026

(54) TRANSFORMER POWER COMBINER APPARATUS AND CONTROL METHOD

(71) Applicant: Shenzhen MUYE Microelectronic Technologies Co., LTD, Shenzhen (CN)

(72) Inventor: Carl Bryant, Maidstone (GB)

(73) Assignee: Shenzhen MUYE Microelectronic Co., Ltd., Shenzhen (CN)

( * ) Notice: Subject to any disclaimer, the term of this patent is extended or adjusted under 35 U.S.C. 154(b) by 445 days.

(21) Appl. No.: 18/230,575

(22) Filed: Aug. 4, 2023

(65) Prior Publication Data

US 2025/0047247 A1 Feb. 6, 2025

(51) Int. Cl.
*H03F 3/21* (2006.01)
*H03F 3/45* (2006.01)

(52) U.S. Cl.
CPC ........ *H03F 3/211* (2013.01); *H03F 2200/537* (2013.01); *H03F 2200/541* (2013.01)

(58) Field of Classification Search
CPC .............. H03F 3/211; H03F 2200/537; H03F 2200/541; H03F 2200/534; H03F 1/565; H03F 3/245; H03F 3/26; H03F 3/45475; H03F 3/68; H03F 3/195; H03F 2200/451
USPC ............................. 330/307, 301, 295, 124 R
See application file for complete search history.

(56) References Cited

U.S. PATENT DOCUMENTS

| | | | | |
|---|---|---|---|---|
| 7,940,152 B1 * | 5/2011 | Kim | ........................ | H01F 19/04 |
| | | | | 336/182 |
| 8,912,865 B2 * | 12/2014 | Kim | ........................ | H03F 3/211 |
| | | | | 333/131 |
| 9,602,065 B2 * | 3/2017 | Mizokami | ................. | H03F 3/72 |
| 2015/0214907 A1 * | 7/2015 | Sivadas | ................... | H03F 3/245 |
| | | | | 330/295 |
| 2015/0372649 A1 * | 12/2015 | Garrec | ...................... | H03F 3/72 |
| | | | | 330/295 |
| 2020/0252036 A1 * | 8/2020 | Li | ........................... | H01F 7/064 |
| 2023/0102583 A1 * | 3/2023 | Mesquita | ............... | H04B 1/581 |
| | | | | 455/78 |

OTHER PUBLICATIONS

Aoki, Ichiro, "Distributed Active Transformer—A New Power-Combining and Impedance-Transformation Technique", IEEE Transactions on Microwave Theory and Techniques, vol. 50, No. 1, Jan. 2002, pp. 316-331.

(Continued)

*Primary Examiner* — Hieu P Nguyen
(74) *Attorney, Agent, or Firm* — AP3 Law Firm PLLC

(57) ABSTRACT

An apparatus includes a first power amplifier having a negative output terminal coupled to a first primary winding of a distributed transformer and a positive output terminal coupled to a second primary winding of the distributed transformer, a second power amplifier having a negative output terminal coupled to a third primary winding of the distributed transformer and a positive output terminal coupled to a fourth primary winding of the distributed transformer, a first conductive element connected between the negative output terminal of the first power amplifier and the negative output terminal of the second power amplifier, and a second conductive element connected between the positive output terminal of the first power amplifier and the positive output terminal of the second power amplifier.

18 Claims, 20 Drawing Sheets

(56)             References Cited

OTHER PUBLICATIONS

He, Ying, et al., "60GHz Power Amplifier with Distributed Active Transformer and Local Feedback", 2010 Proceedings of ESSCIRC, Seville, Spain, 2010, pp. 314-317.
Jen, Yung-Nien, et al., "Design and Analysis of a 55-71-GHz Compact and Broadband Distributed Active Transformer Power Amplifier in 90-nm CMOS Process", IEEE Transactions on Microwave Theory and Techniques, vol. 57, No. 7, Jul. 2009, pp. 1637-1646.

* cited by examiner

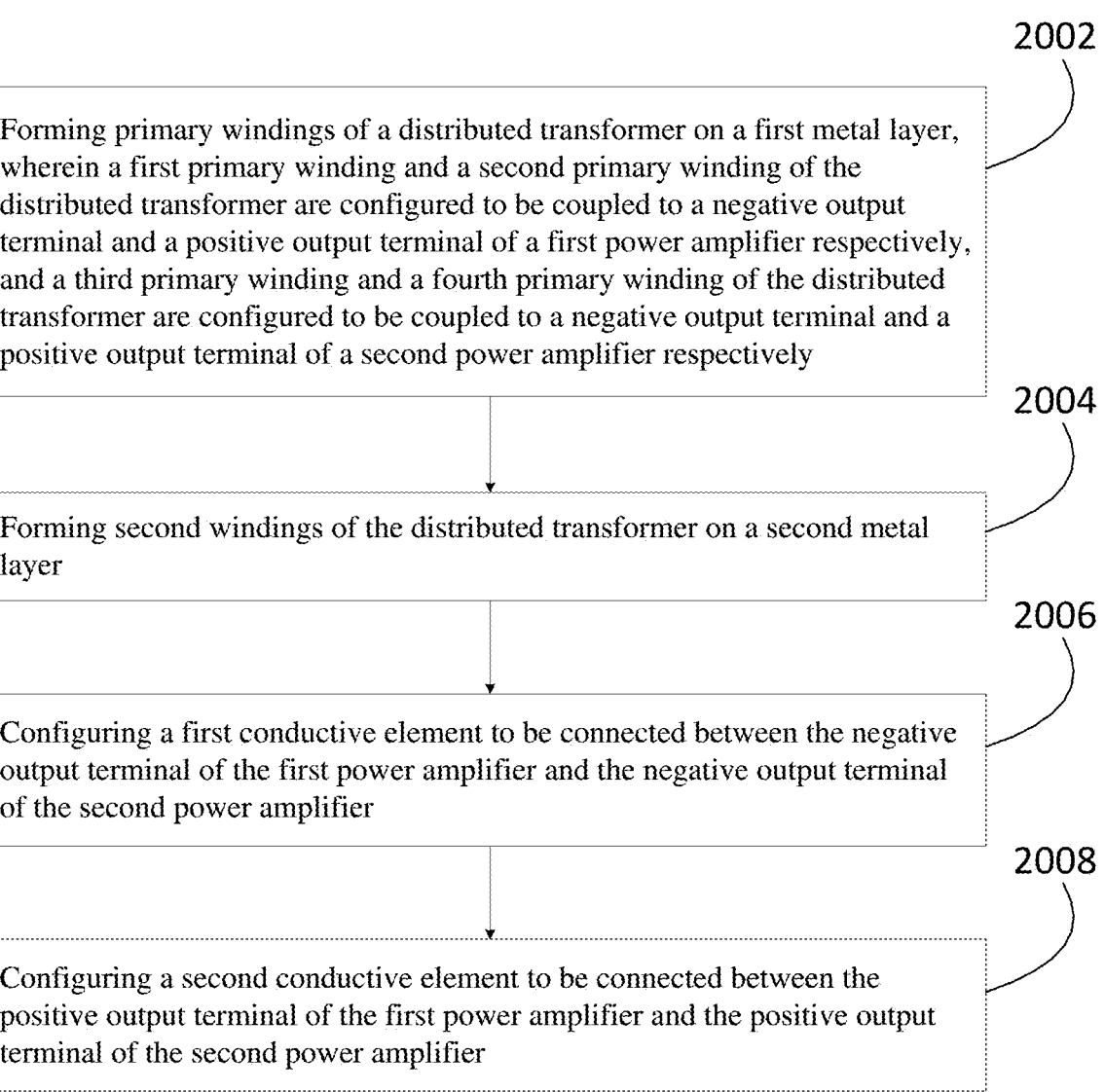

2002

Forming primary windings of a distributed transformer on a first metal layer, wherein a first primary winding and a second primary winding of the distributed transformer are configured to be coupled to a negative output terminal and a positive output terminal of a first power amplifier respectively, and a third primary winding and a fourth primary winding of the distributed transformer are configured to be coupled to a negative output terminal and a positive output terminal of a second power amplifier respectively

2004

Forming second windings of the distributed transformer on a second metal layer

2006

Configuring a first conductive element to be connected between the negative output terminal of the first power amplifier and the negative output terminal of the second power amplifier

2008

Configuring a second conductive element to be connected between the positive output terminal of the first power amplifier and the positive output terminal of the second power amplifier

Figure 20

TRANSFORMER POWER COMBINER APPARATUS AND CONTROL METHOD

TECHNICAL FIELD

Embodiments of the invention relate to a transformer power combiner balancing apparatus, and, in particular embodiments, to a transformer power combiner balancing apparatus for reducing imbalance between different power amplifiers.

BACKGROUND

Various power combining techniques have been employed in power amplifiers to provide signals to be transmitted (e.g., RF signals) with sufficient signal power. One common power combining implementation is to use a transformer power combiner.

FIG. 1 illustrates a schematic diagram of a conventional power amplifier system. The power amplifier system includes a transformer power combiner 100 and a plurality of power amplifiers 101 and 102. The transformer power combiner 100 comprises primary windings NP1, NP2, NP3 and NP4, and secondary windings NS1, NS2, NS3 and NS4.

Each power amplifier has inputs connected to an input signal source (not shown). The inputs of each power amplifier are driven with a differential input signal. Vm1 is a negative output terminal of the power amplifier 101. Vp1 is a positive output terminal of the power amplifier 101. Vm2 is a negative output terminal of the power amplifier 102. Vp2 is a positive output terminal of the power amplifier 102.

As shown in FIG. 1, Vm1 is coupled to a first terminal of the first primary winding NP1. A second terminal of the first primary winding NP1 is connected to a bias voltage VDD. Vp1 is coupled to a first terminal of the second primary winding NP2. A second terminal of the second primary winding NP2 is connected to VDD. Vm2 is coupled to a first terminal of the third primary winding NP3. A second terminal of the third primary winding NP3 is connected to VDD. Vp2 is coupled to a first terminal of the fourth primary winding NP4. A second terminal of the fourth primary winding NP4 is connected to VDD.

The first secondary winding NS1 is magnetically coupled to the first primary winding NP1. The second secondary winding NS2 is magnetically coupled to the second primary winding NP2. The third secondary winding NS3 is magnetically coupled to the third primary winding NP3. The fourth secondary winding NS4 is magnetically coupled to the fourth primary winding NP4. The first secondary winding NS1, the second secondary winding NS2, the third secondary winding NS3 and the fourth secondary winding NS4 are connected in series between an output port Vo and ground.

Assuming that the turn ratio of each transformer is 1:1, the output voltage across the output port and ground is equal to a sum of the input voltages presented at the input ports of the transformer power combiner 100.

FIG. 2 illustrates a layout of the primary windings and secondary windings of the conventional power amplifier system shown in FIG. 1. The layout of the primary windings is shown in the dashed rectangle 202. The first primary winding NP1, the second primary winding NP2, the third primary winding NP3 and the fourth primary winding NP4 are formed on a first metal layer. These four primary windings form an octagon geometry having two openings. Two terminals of the upper opening function as a first negative port and a first positive port. The first negative port and the first positive port are connected to Vm1 and Vp1, respectively. Two terminals of the lower opening function as a second negative port and a second positive port. The second negative port and the second positive port are connected to Vm2 and Vp2, respectively.

The first primary winding NP1 and the fourth primary winding NP4 form a first metal trace extending from the first negative port to the second positive port. A center tap of the first metal trace is connected to VDD. The second primary winding NP2 and the third primary winding NP4 form a second metal trace extending from the first positive port to the second negative port. A center tap of the second metal trace is connected to VDD.

The layout of the secondary windings is shown in the dashed rectangle 204. The first secondary winding NS1, the second secondary winding NS2, the third secondary winding NS3 and the fourth secondary winding NS4 are formed on a second metal layer. The first secondary winding NS1, the second secondary winding NS2, the third secondary winding NS3 and the fourth secondary winding NS4 form a third metal trace having an octagon shape with an opening. Two terminals of this opening are Vo and GND, respectively. The third trace extends from Vo to GND.

FIG. 3 illustrates a layout of the secondary windings stacked over the primary windings. The second metal layer is formed over the first metal layer. The third metal trace formed by NS1, NS2, NS3 and NS4 is over the first metal trace and the second metal trace.

As shown in FIG. 3, the opening of the secondary windings is over the right side of the primary windings. In operation, the secondary windings may cause left-right asymmetry on the power amplifiers and the transformer power combiner 100. This left-right asymmetry may cause extra stress on the power amplifiers, thereby preventing the transformer power combiner from achieving better power combining efficiency. It would be desirable to have a simple and reliable apparatus to reduce imbalance between different power amplifiers.

SUMMARY

These and other problems are generally solved or circumvented, and technical advantages are generally achieved, by preferred embodiments of the present disclosure which provide a transformer power combiner balancing apparatus for reducing imbalance between different power amplifiers.

In accordance with an embodiment, an apparatus comprises a first power amplifier having a negative output terminal coupled to a first primary winding of a distributed transformer and a positive output terminal coupled to a second primary winding of the distributed transformer, a second power amplifier having a negative output terminal coupled to a third primary winding of the distributed transformer and a positive output terminal coupled to a fourth primary winding of the distributed transformer, a first conductive element connected between the negative output terminal of the first power amplifier and the negative output terminal of the second power amplifier, and a second conductive element connected between the positive output terminal of the first power amplifier and the positive output terminal of the second power amplifier.

In accordance with another embodiment, a method comprises forming primary windings of a distributed transformer on a first metal layer, wherein a first primary winding and a second primary winding of the distributed transformer are configured to be coupled to a negative output terminal and a positive output terminal of a first power amplifier respectively, and a third primary winding and a fourth primary winding of the distributed transformer are configured to be coupled to a negative output terminal and a positive output terminal of a second power amplifier respectively, forming second windings of the distributed transformer on a second metal layer, configuring a first conductive element to be connected between the negative output terminal of the first power amplifier and the negative output terminal of the second power amplifier, and configuring a second conductive element to be connected between the positive output terminal of the first power amplifier and the positive output terminal of the second power amplifier.

In accordance with yet another embodiment, a system comprises a first power amplifier having a negative output terminal coupled to a first primary winding of a distributed transformer and a positive output terminal coupled to a second primary winding of the distributed transformer, a second power amplifier having a negative output terminal coupled to a third primary winding of the distributed transformer and a positive output terminal coupled to a fourth primary winding of the distributed transformer, a first conductive element connected between the negative output terminal of the first power amplifier and the negative output terminal of the second power amplifier, a second conductive element connected between the positive output terminal of the first power amplifier and the positive output terminal of the second power amplifier, a first secondary winding of the distributed transformer magnetically coupled to the first primary winding of the distributed transformer, a second secondary winding of the distributed transformer magnetically coupled to the second primary winding of the distributed transformer, a third secondary winding of the distributed transformer magnetically coupled to the third primary winding of the distributed transformer, and a fourth secondary winding of the distributed transformer magnetically coupled to the fourth primary winding of the distributed transformer, wherein the first secondary winding, the second secondary winding, the third secondary winding and the fourth secondary winding of the distributed transformer are connected in series between a first output port and a second output port.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 20 illustrates a flow chart of forming the transformer power combiner system shown in FIG. 4 in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a transformer power combiner balancing apparatus for reducing imbalance between two different power amplifiers. The disclosure may also be applied, however, to a transformer power combiner balancing apparatus for reducing imbalance between multiple power amplifiers. Hereinafter, various embodiments will be explained in detail with reference to the accompanying drawings.

Figure 4:
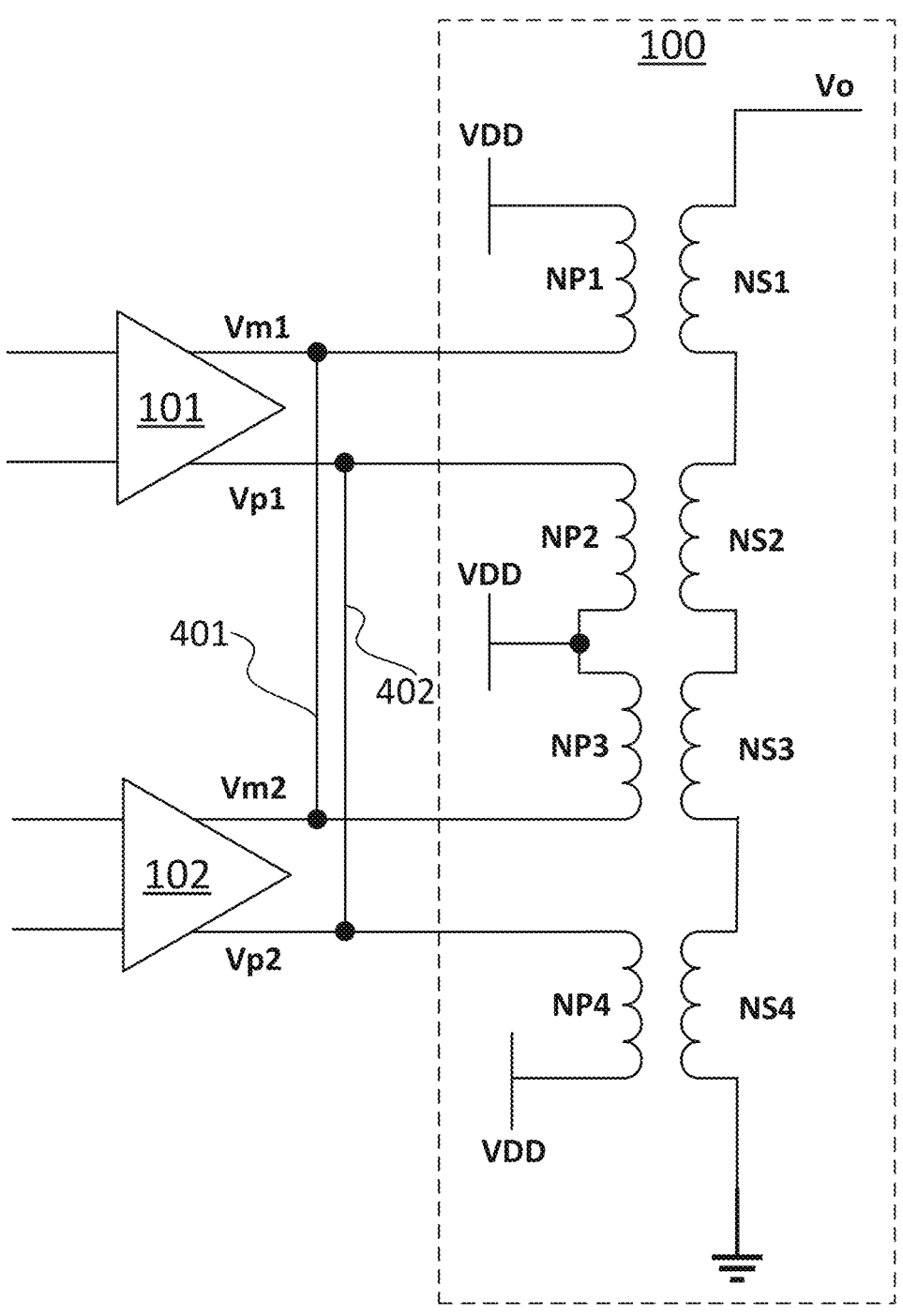
FIG. 4 illustrates a schematic diagram of a transformer power combiner system in accordance with various embodiments of the present disclosure.

FIG. 4 illustrates a schematic diagram of a transformer power combiner system in accordance with various embodiments of the present disclosure. The transformer power combiner system comprises a plurality of power amplifiers 101, 102 and a transformer power combiner 100. The transformer power combiner 100 comprises primary windings NP1, NP2, NP3 and NP4, and secondary windings NS1, NS2, NS3 and NS4. The primary windings NP1, NP2, NP3 and NP4 are connected to the outputs of the power amplifiers 101 and 102. The secondary windings NS1, NS2, NS3 and NS4 are connected in series between an output port Vo and ground. As a result, the voltages from the plurality of power amplifiers 101 and 102 are effectively combined in series at the output port Vo. The transformer power combiner 100 shown in FIG. 4 is also known as a distributed transformer. Throughout the description, the transformer power combiner 100 may be alternatively referred to as a distributed transformer 100.

To lower unwanted harmonics (e.g., even harmonics), the power amplifiers 101 and 102 are driven differentially. In some embodiments, each power amplifier processes the input differential signal and generates output signals at a positive output terminal and a negative output terminal. As shown in FIG. 4, Vm1 is denoted as a negative output terminal of the first power amplifier 101. Vp1 is denoted as a positive output terminal of the first power amplifier 101. Vm2 is denoted as a negative output terminal of the second power amplifier 102. Vp2 is denoted as a positive output terminal of the second power amplifier 102.

As shown in FIG. 4, the negative output terminal Vm1 of the first power amplifier 101 is coupled to a first terminal of the first primary winding NP1. A second terminal of the first primary winding NP1 is connected to a predetermined bias voltage VDD. The positive output terminal Vp1 of the first power amplifier 101 is coupled to a first terminal of the second primary winding NP2. A second terminal of the second primary winding NP2 is connected to the predetermined bias voltage VDD.

The negative output terminal Vm2 of the second power amplifier 102 is coupled to a first terminal of the third primary winding NP3. A second terminal of the third primary winding NP3 is connected to the predetermined bias voltage VDD. The positive output terminal Vp2 of the second power amplifier 102 is coupled to a first terminal of the fourth primary winding NP4. A second terminal of the fourth primary winding NP4 is connected to the predetermined bias voltage VDD.

It should be noted that the VDD connection shown in FIG. 4 is merely an example, which should not unduly limit the scope of the claims. One of ordinary skill in the art would recognize many variations, alternatives, and modifications. For example, depending on different applications and design needs, some amplifier structures can feed the supply current separately from the transformer. For those power amplifiers, the VDD connections could be different.

A first conductive element 401 is connected between the negative output terminal Vm1 of the first power amplifier 101 and the negative output terminal Vm2 of the second power amplifier 102. A second conductive element 402 is connected between the positive output terminal Vp1 of the first power amplifier 101 and the positive output terminal Vp2 of the second power amplifier 102. In some embodiments, the first conductive element 401 and the second conductive element 402 are formed of suitable conductive materials such as copper.

As shown in FIG. 4, the first secondary winding NS1 is magnetically coupled to the first primary winding NP1. The second secondary winding NS2 is magnetically coupled to the second primary winding NP2. The third secondary winding NS3 is magnetically coupled to the third primary winding NP3. The fourth secondary winding NS4 is magnetically coupled to the fourth primary winding NP4. As shown in FIG. 4, the first secondary winding NS1, the second secondary winding NS2, the third secondary winding NS3 and the fourth secondary winding NS4 are connected in series between a first output port and a second output port. The first output port is the output of the distributed transformer. In some embodiments, the output of the distributed transformer is connected to a load. The second output port is connected to ground.

Figure 1:
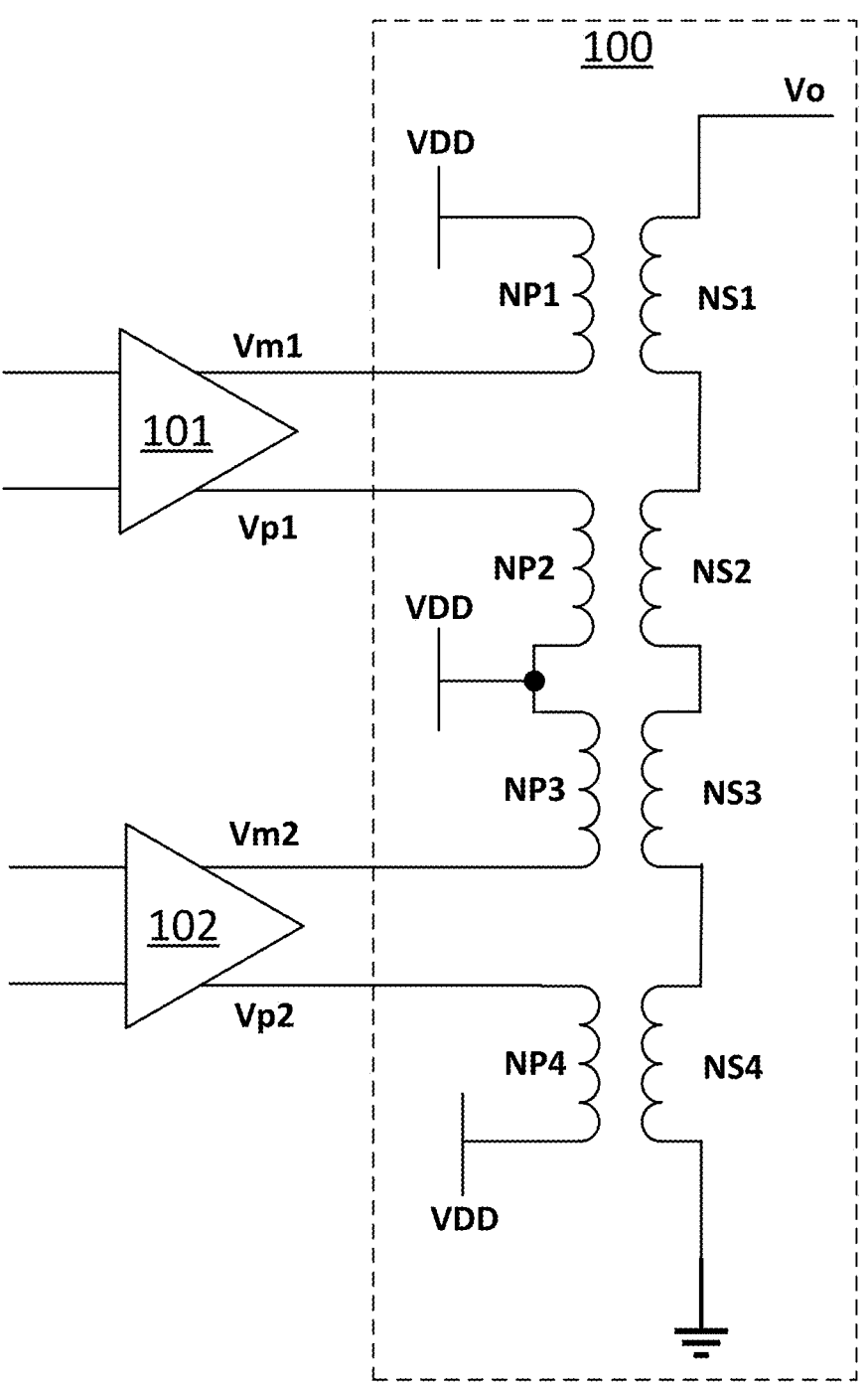
FIG. 1 illustrates a schematic diagram of a conventional power amplifier system.
Figure 2:
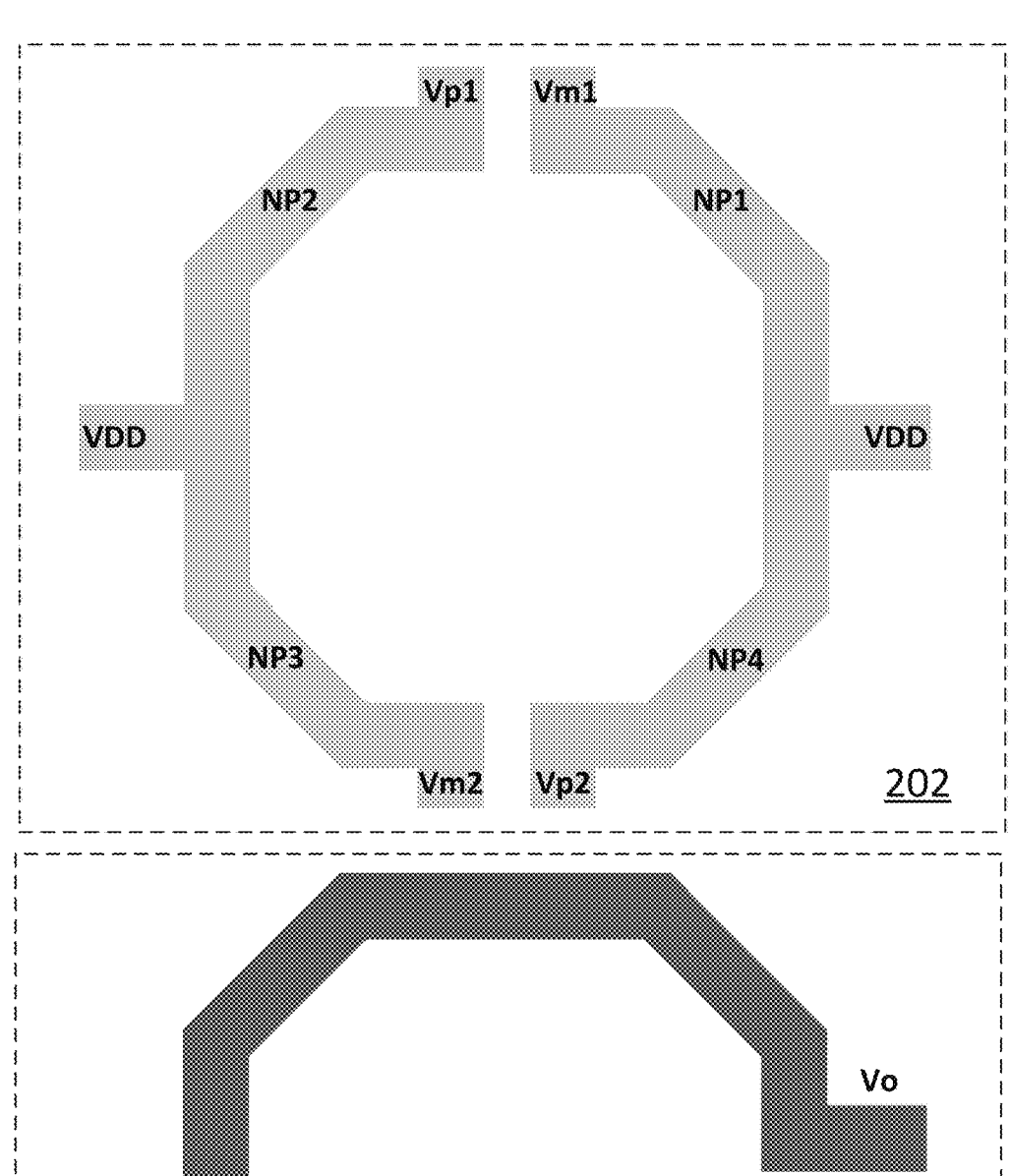
FIG. 2 illustrates a layout of the primary windings and secondary windings of the conventional power amplifier system shown in FIG. 1.
Figure 3:
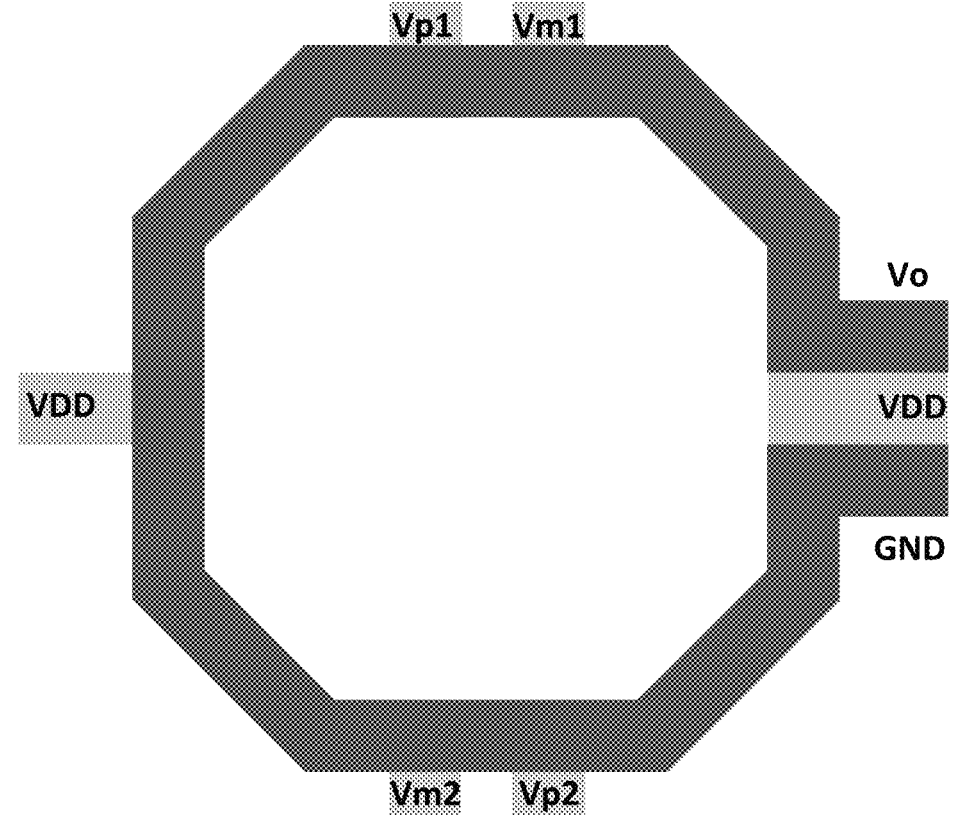
FIG. 3 illustrates a layout of the secondary windings stacked over the primary windings.

Referring back to FIG. 3, the opening of the secondary windings is over the right side of the primary windings. In operation, the secondary windings may cause left-right asymmetry on the distributed transformer 100. In addition, one output terminal of the distributed transformer 100 is grounded. This may cause asymmetric swings on the outputs of the distributed transformer 100. In some embodiments, the primary windings may be formed on a first metal layer over a semiconductor substrate. The secondary windings may be formed on a second metal layer over the first metal layer. Distributed capacitance may exist between these two metal layers, allowing the flow of unwanted induced currents. The induced currents may change the impedance seen by each output of the power amplifier, resulting in slightly different output voltage swings. The different output voltage swings may prevent the power amplifiers from delivering more power.

One advantageous feature of having the first conductive element 401 connected between Vm1 and Vm2 is that both Vm1 and Vm2 can be forced to be the same voltage potential. Likewise, the second conductive element 402 connected between Vp1 and Vp2 can force the voltage of Vp1 to be equal to the voltage of Vp2. As such, each power amplifier is able to drive input port pairs of the distributed transformer equally. For example, prior to adding the first conductive element 401 and the second conductive element 402, the ratio of (Vp1-Vm1) to (Vp2-Vm2) is equal to 1.18. After adding the first conductive element 401 and the second conductive element 402 as shown in FIG. 4, the ratio of (Vp1-Vm1) to (Vp2-Vm2) is equal to 0.96. This ratio difference indicates the imbalance between these two power amplifiers has been improved.

The first conductive element 401 and the second conductive element 402 function as a transformer power combiner balancing apparatus. Throughout the description, the first conductive element 401 and the second conductive element 402 may be collectively referred to as a transformer power combiner balancing apparatus.

In some embodiments, the first conductive element 401 and the second conductive element 402 are implemented as a symmetric structure including two groups of parallel lines and an X-shaped crossover connected between these two groups of parallel lines. The detailed structure of this implementation of this transformer power combiner balancing apparatus will be discussed below with respect to FIGS. 5-6.

In some embodiments, the first conductive element 401 and the second conductive element 402 are implemented as a symmetric structure including two groups of parallel lines and three X-shaped crossovers. The three X-shaped crossovers and the two groups of parallel lines are arranged in an alternating manner. The detailed structure of this implementation of this transformer power combiner balancing apparatus will be discussed below with respect to FIGS. 7-8.

In some embodiments, the first conductive element 401 and the second conductive element 402 are implemented as a symmetric structure including one group of parallel lines and an X-shaped crossover. The detailed structure of this implementation of this transformer power combiner balancing apparatus will be discussed below with respect to FIGS. 9-10.

In some embodiments, the first conductive element 401 and the second conductive element 402 are implemented as a symmetric structure including two groups of parallel lines and an X-shaped crossover connected between these two groups of parallel lines. In order to achieve a predetermined impedance, inductive elements and capacitive elements may be added into the parallel lines. The detailed structure of this implementation of this transformer power combiner balancing apparatus will be discussed below with respect to FIGS. 11-12.

Figure 5:
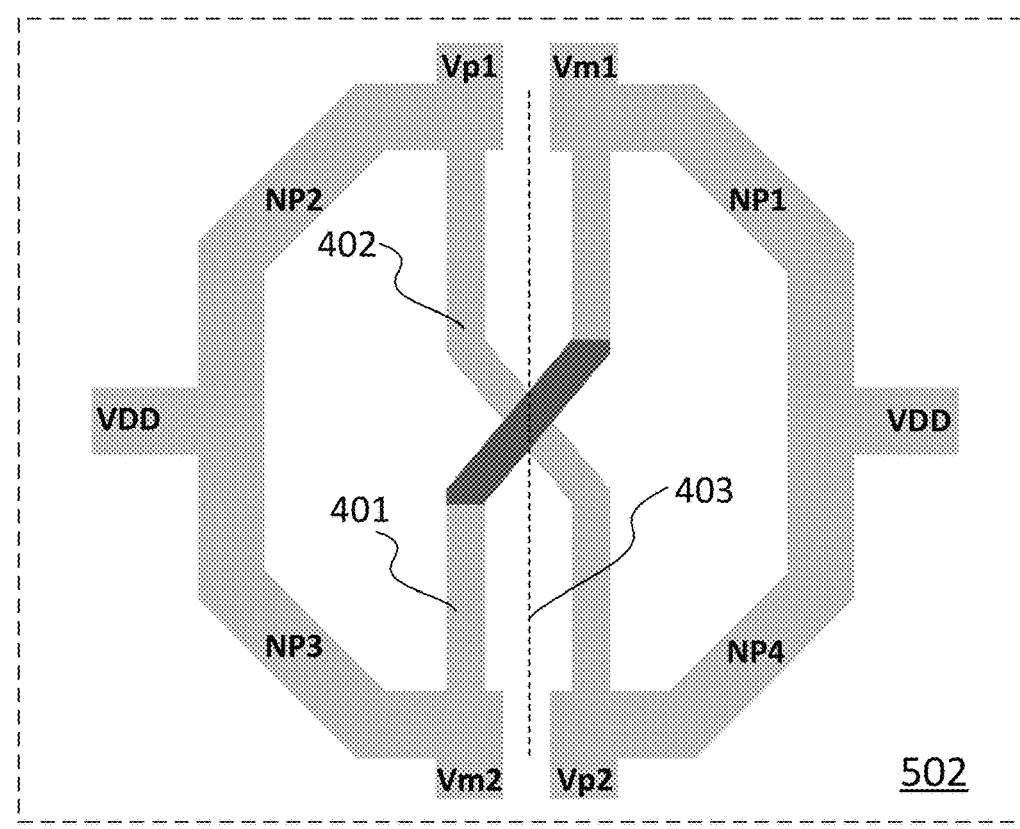
FIG. 5 illustrates a layout of a first implementation of the transformer power combiner balancing apparatus shown in FIG. 4 in accordance with various embodiments of the present disclosure.
Figure 5:
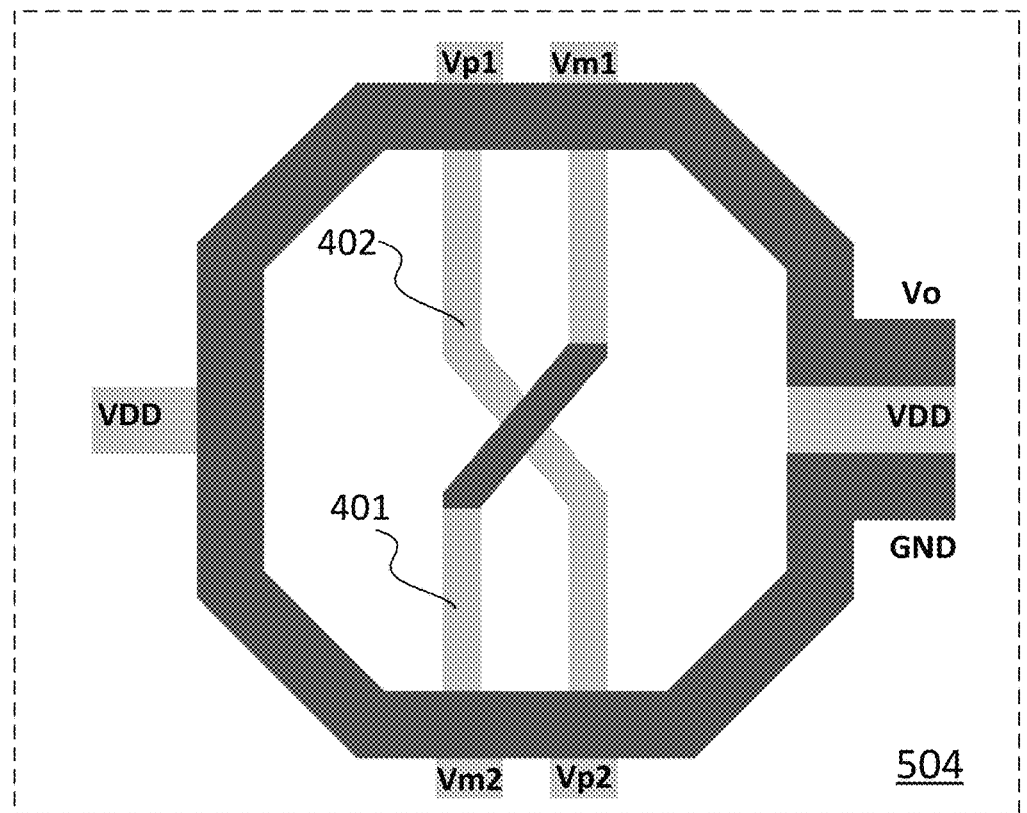

FIG. 5 illustrates a layout of a first implementation of the transformer power combiner balancing apparatus shown in FIG. 4 in accordance with various embodiments of the present disclosure. The layout of the primary windings and the transformer power combiner balancing apparatus is shown in the dashed rectangle 502. In some embodiments, the first primary winding NP1, the second primary winding NP2, the third primary winding NP3 and the fourth primary winding NP4 are formed on a first metal layer. The first metal layer is colored in gray. These four primary windings form an octagon geometry having two openings. Two terminals of the upper opening function as a first negative port and a first positive port. As shown in FIG. 5, the first negative port and the first positive port are connected to Vm1 and Vp1, respectively. Two terminals of the lower opening function as a second negative port and a second positive port. As shown in FIG. 5, the second negative port and the second positive port are connected to Vm2 and Vp2, respectively.

As shown in FIG. 5, the first primary winding NP1 and the fourth primary winding NP4 form a first metal trace extending from the first negative port (Vm1) connected to the negative terminal of the first power amplifier 101, to the second positive port (Vp2) connected to the positive terminal of the second power amplifier 102. A center tap of the first metal trace is connected to the predetermined bias voltage VDD.

As shown in FIG. 5, the second primary winding NP2 and the third primary winding NP3 form a second metal trace extending from the first positive port (Vp1) connected to the positive terminal of the first power amplifier 101, to the second negative port (Vm2) connected to the negative terminal of the second power amplifier 102. A center tap of the second metal trace is connected to the predetermined bias voltage VDD.

As shown in FIG. 5, the first metal trace and the second metal trace are symmetric with respect to a middle line 403. The middle line 403 is placed between the first metal trace and the second metal trace. The distance from the middle line 403 to the first metal trace is equal to the distance from the middle line 403 to the second metal trace.

The first secondary winding NS1, the second secondary winding NS2, the third secondary winding NS3 and the fourth secondary winding NS4 are formed on a second metal layer over the first metal layer. The second metal layer is colored in black. The layout of the secondary windings and the transformer power combiner balancing apparatus are shown in the dashed rectangle 504. As shown in FIG. 5, the first secondary winding NS1, the second secondary winding NS2, the third secondary winding NS3 and the fourth secondary winding NS4 form a third metal trace having an octagon shape with an opening. Two terminals of this opening are the first output port Vo and the second output port GND, respectively. The third trace extends from the first output port Vo to the second output port GND.

The first conductive element 401 comprises a first portion connected to the first negative port (Vm1), a second portion connected to the second negative port (Vm2), and a middle portion connected between the first portion and the second portion of the first conductive element 401.

The second conductive element 402 comprises a first portion connected to the first positive port (Vp1), a second portion connected to the second positive port (Vp2), and a middle portion connected between the first portion and the second portion of the second conductive element 402.

As shown in FIG. 5, the first portion of the first conductive element 401 is in parallel with the first portion of the second conductive element 402. The second portion of the first conductive element 401 is in parallel with the second portion of the second conductive element 402. The middle portion of the first conductive element 401 and the middle portion of the second conductive element 402 are formed in different metal layers and diagonally cross each other. As indicated by the colors of these two middle portions, the middle portion of the first conductive element 401 is formed on the second metal layer. The middle portion of the second conductive element 402 is formed on the first metal layer. The middle portion of the first conductive element 401 is connected to the other two portions of the first conductive element 401 through suitable interconnect structures such as vias.

It should be noted that forming the middle portion of the first conductive element 401 on the second metal layer is merely an example, which should not unduly limit the scope of the claims. One of ordinary skill in the art would recognize many variations, alternatives, and modifications. For example, depending on design needs and different applications, the middle portion of the second conductive element 402 may be formed on the second metal layer, and the middle portion of the first conductive element 401 may be formed on the first metal layer.

In some embodiments, the width of the first metal trace (NP1 and NP4) and the second metal trace (NP2 and NP3) is in a range from about 5 μm to about 6 μm. The width of the first conductive element 401 and the second conductive element 402 is in a range from about 2 μm to about 3 μm. The spacing between the first conductive element 401 and the second conductive element 402 is about 6.5 μm.

Figure 6:
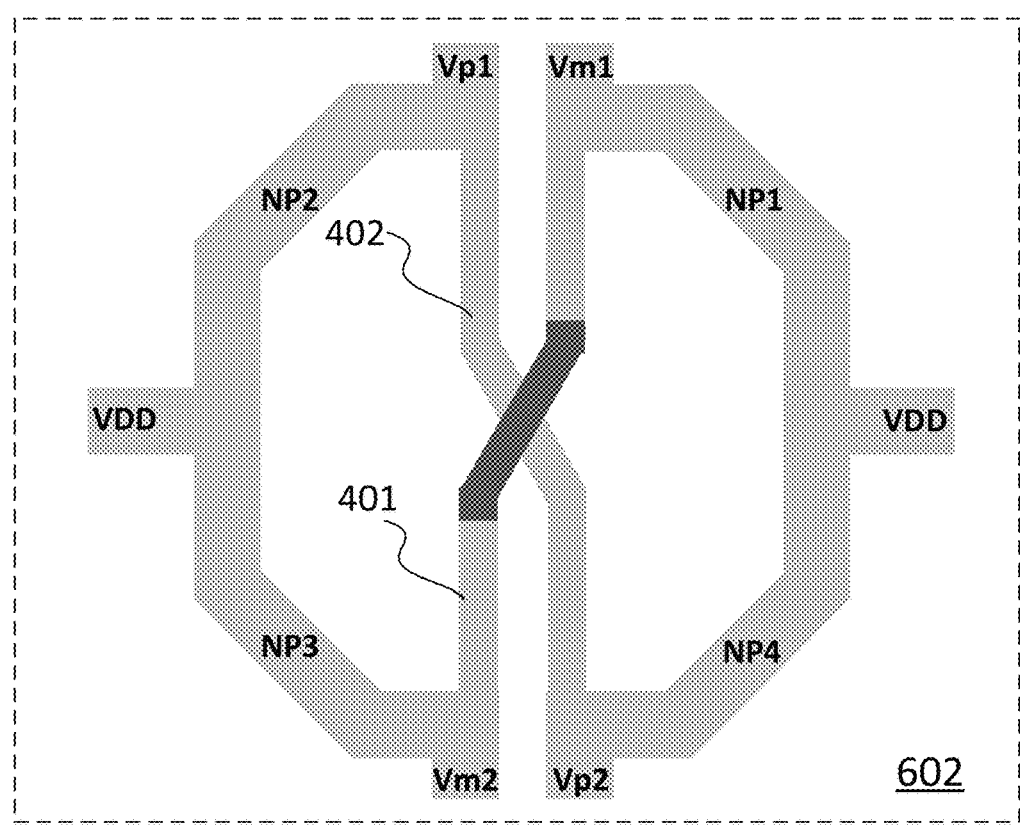
FIG. 6 illustrates a layout of a second implementation of the transformer power combiner balancing apparatus shown in FIG. 4 in accordance with various embodiments of the present disclosure.
Figure 6:
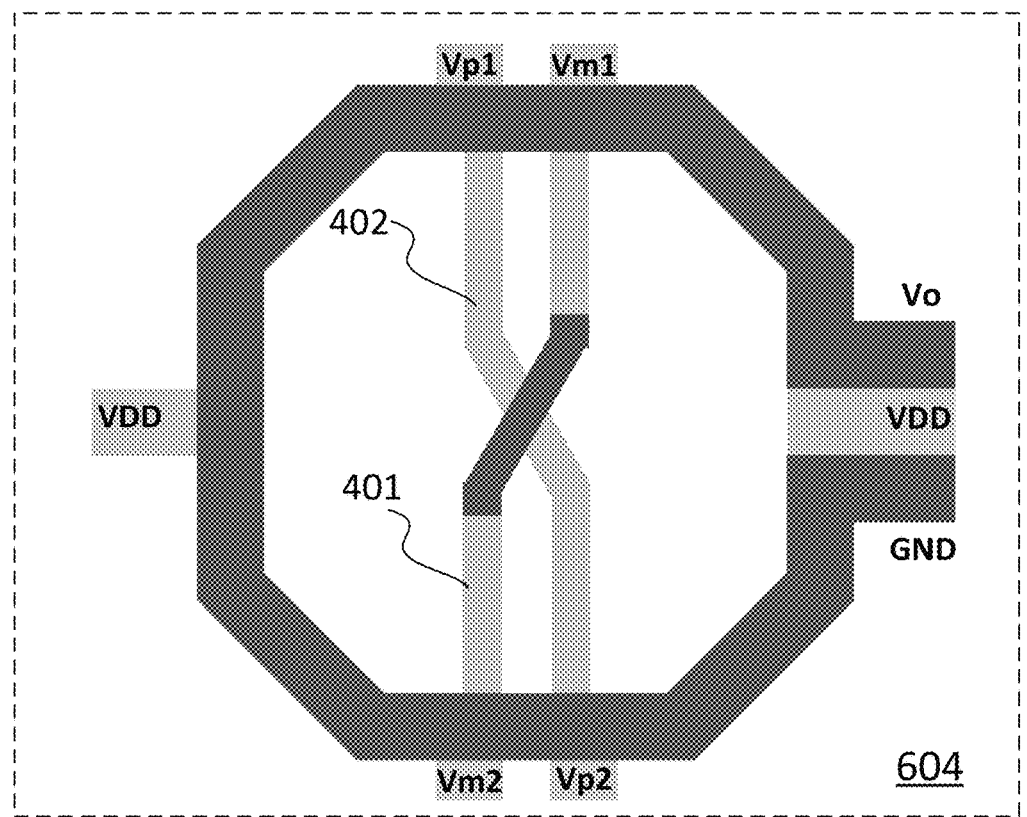

FIG. 6 illustrates a layout of a second implementation of the transformer power combiner balancing apparatus shown in FIG. 4 in accordance with various embodiments of the present disclosure. The second implementation shown in dashed rectangles 602 and 604 is similar to the first implementation shown in FIG. 5 except that the spacing between the first conductive element 401 and the second conductive element 402 is reduced from about 6.5 μm to about 4 μm. The reduced spacing helps to reduce the inductance of the conductive elements slightly.

Figure 7:
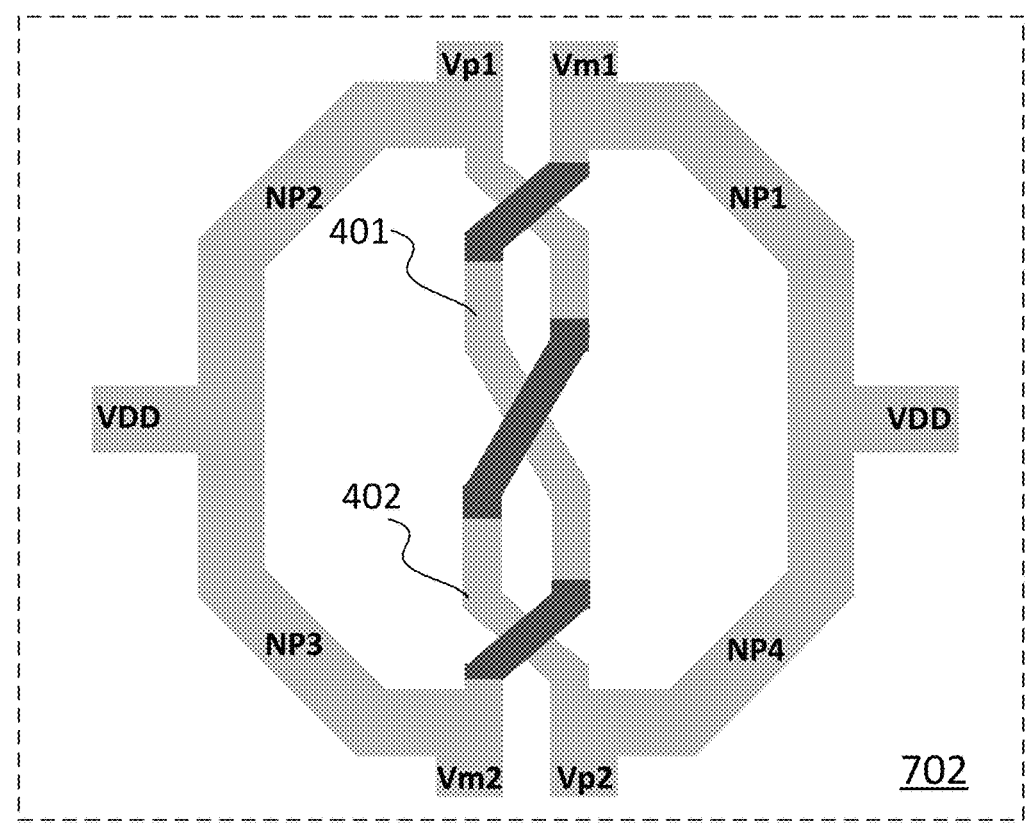
FIG. 7 illustrates a layout of a third implementation of the transformer power combiner balancing apparatus shown in FIG. 4 in accordance with various embodiments of the present disclosure.
Figure 7:
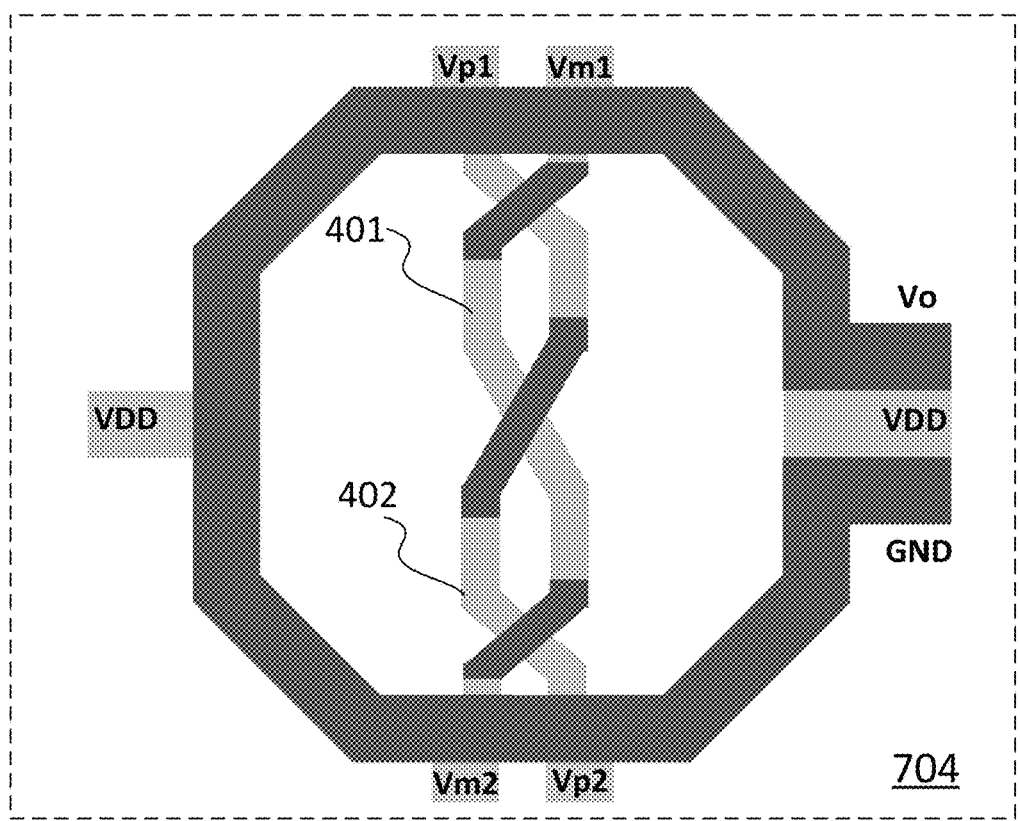

FIG. 7 illustrates a layout of a third implementation of the transformer power combiner balancing apparatus shown in FIG. 4 in accordance with various embodiments of the present disclosure. The third implementation shown in dashed rectangles 702 and 704 is similar to the first implementation shown in FIG. 5 and the second implementation shown in FIG. 6 except that the transformer power combiner balancing apparatus includes two more X-shaped crossovers.

As shown in FIG. 7, the first conductive element 401 comprises a first portion connected to the first negative port (Vm1), a second portion connected to the second negative port (Vm2), and a middle portion connected between the first portion and the second portion of the first conductive element 401. As shown in FIG. 7, the alternating colors of these three portions indicate that the first conductive element 401 is formed on two different metal layers.

As shown in FIG. 7, the second conductive element 402 comprises a first portion connected to the first positive port (Vp1), a second portion connected to the second positive port (Vp2), and a middle portion connected between the first portion and the second portion of the second conductive element 402. As shown in FIG. 7, the alternating colors of these three portions indicate that the second conductive element 402 is formed on the two different metal layers.

As shown in FIG. 7, a portion of the first portion of the first conductive element 401 diagonally crosses over a portion of the first portion of the second conductive element 402. A portion of the second portion of the first conductive element 401 diagonally crosses over a portion of the second portion of the second conductive element 402. A portion of the middle portion of the first conductive element 401 diagonally crosses over a portion of the middle portion of the second conductive element 402.

As shown in FIG. 7, between the upper X-shaped crossover and the middle X-shaped crossover, the portion of the first conductive element 401 is in parallel with the portion of the second conductive element 402. Likewise, between the middle X-shaped crossover and the lower X-shaped crossover, the portion of the first conductive element 401 is in parallel with the portion of the second conductive element 402.

Figure 8:
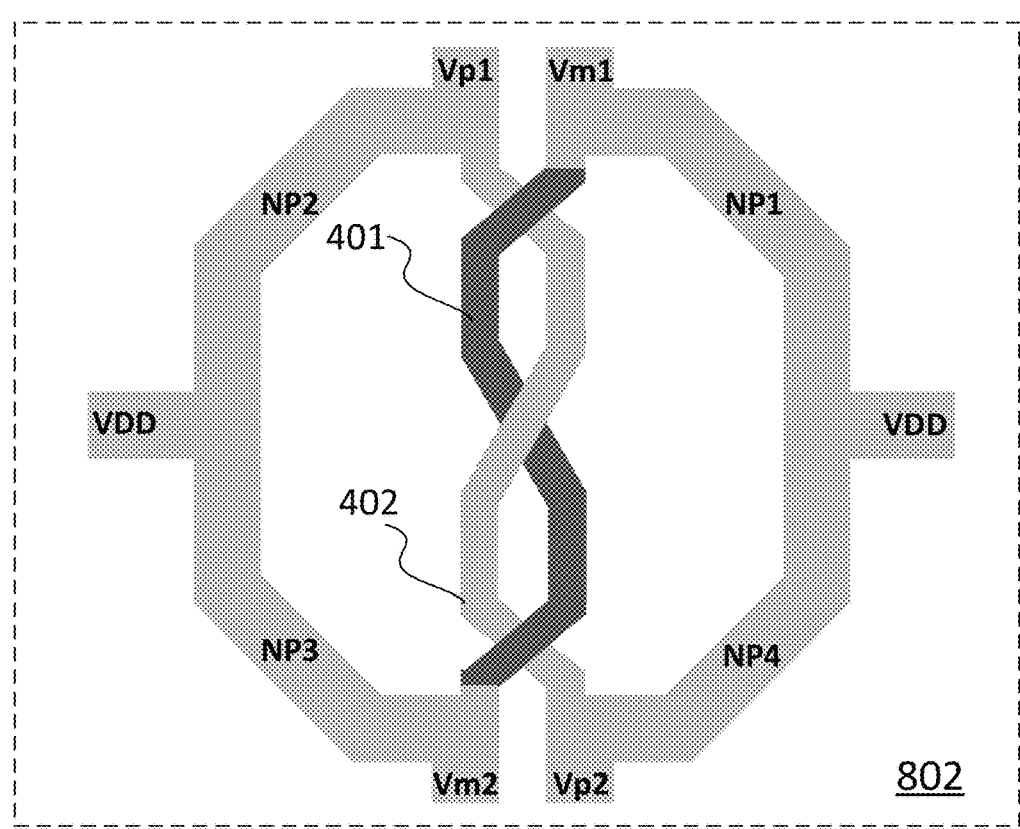
FIG. 8 illustrates a layout of a fourth implementation of the transformer power combiner balancing apparatus shown in FIG. 4 in accordance with various embodiments of the present disclosure.
Figure 8:
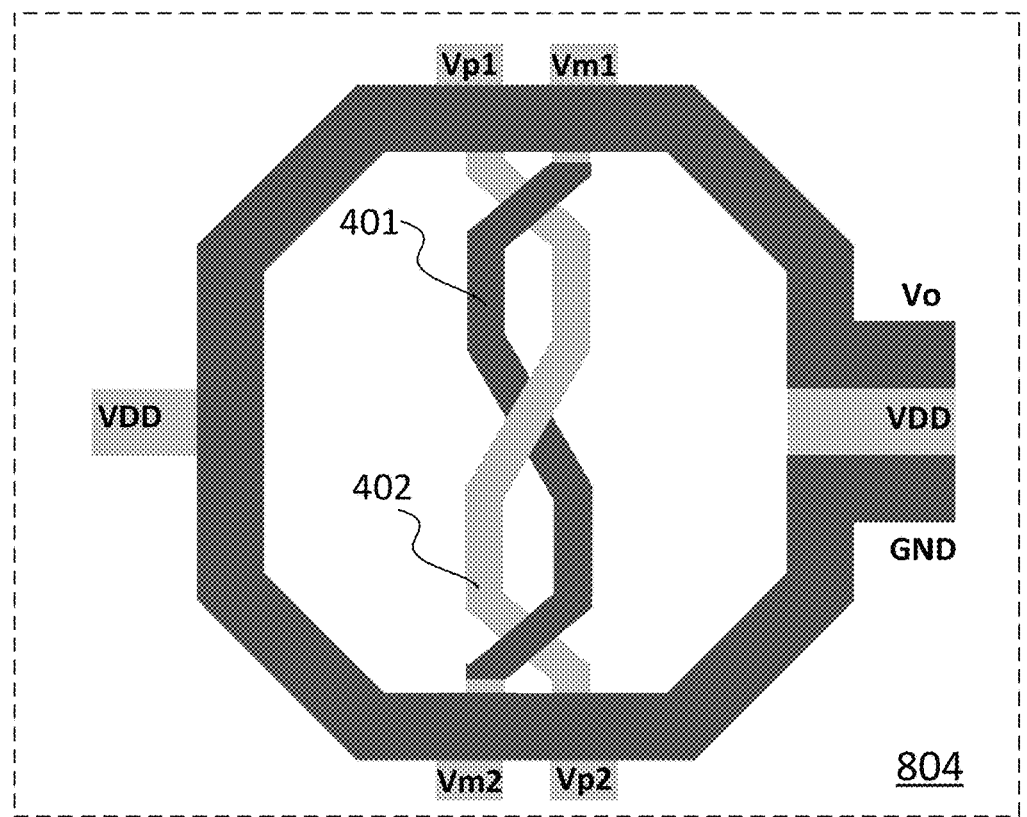

FIG. 8 illustrates a layout of a fourth implementation of the transformer power combiner balancing apparatus shown in FIG. 4 in accordance with various embodiments of the present disclosure. The fourth implementation shown in dashed rectangles 802 and 804 is similar to the third implementation shown in FIG. 7 except that the first conductive element 401 is formed on the second metal layer, and the second conductive element 402 is formed on the first metal layer.

It should be noted that the arrangement of the first conductive element 401 and the second conductive element 402 shown in FIG. 8 is merely an example, which should not unduly limit the scope of the claims. One of ordinary skill in the art would recognize many variations, alternatives, and modifications. For example, depending on design needs and different applications, the first conductive element 401 may be formed on the first metal layer, and the second conductive element 402 may be formed on the second metal layer.

Figure 9:
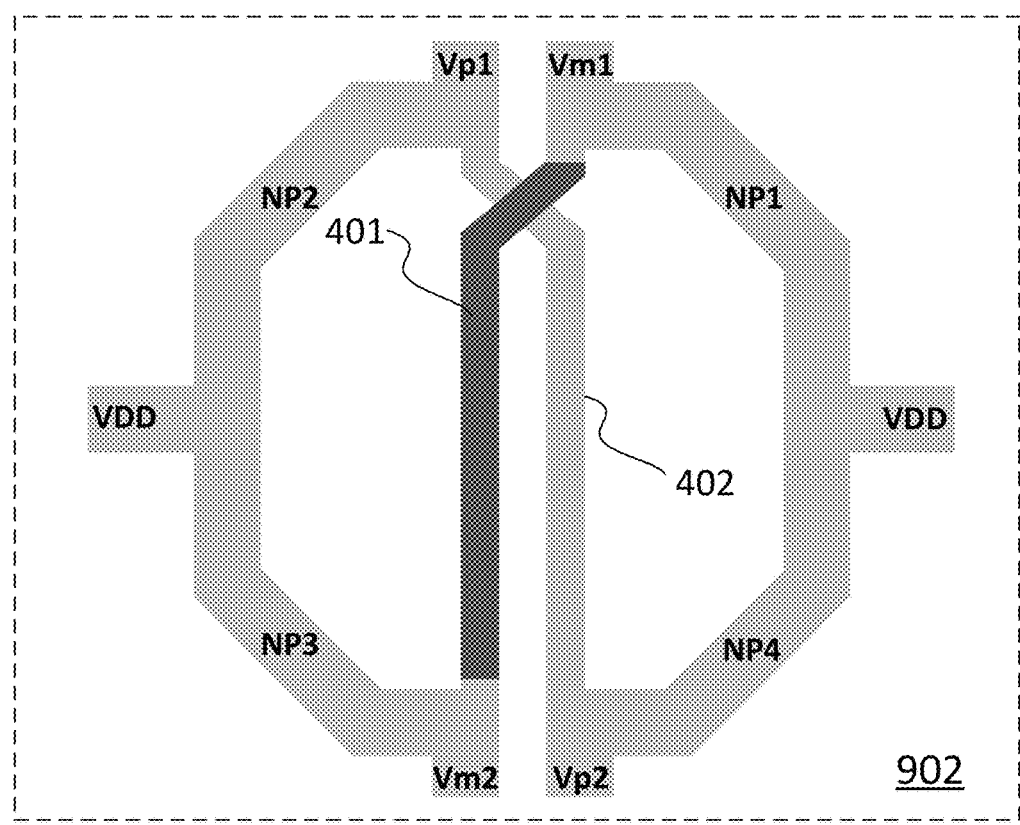
FIG. 9 illustrates a layout of a fifth implementation of the transformer power combiner balancing apparatus shown in FIG. 4 in accordance with various embodiments of the present disclosure.
Figure 9:
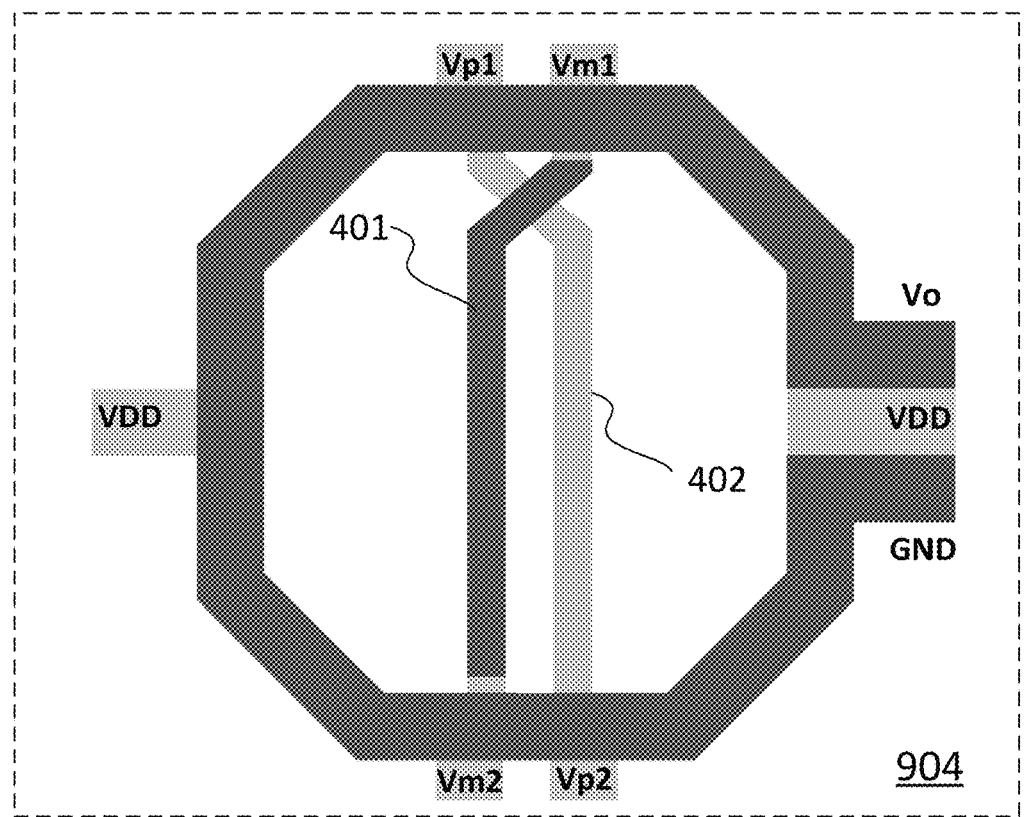

FIG. 9 illustrates a layout of a fifth implementation of the transformer power combiner balancing apparatus shown in FIG. 4 in accordance with various embodiments of the present disclosure. The fifth implementation shown in dashed rectangles 902 and 904 is similar to the first implementation shown in FIG. 5 except that the X-shaped crossover is adjacent to Vp1 and Vm1.

As shown in FIG. 9, the first conductive element 401 comprises a first portion connected to the first negative port (Vm1) and a second portion connected to the second negative port (Vm2). The second conductive element 402 comprises a first portion connected to the first positive port (Vp1) and a second portion connected to the second positive port (Vp2). A portion of the first portion of the first conductive element 401 diagonally crosses over a portion of the first portion of the second conductive element 402. The second portion of the first conductive element 401 is in parallel with the second portion of the second conductive element 402.

Figure 10:
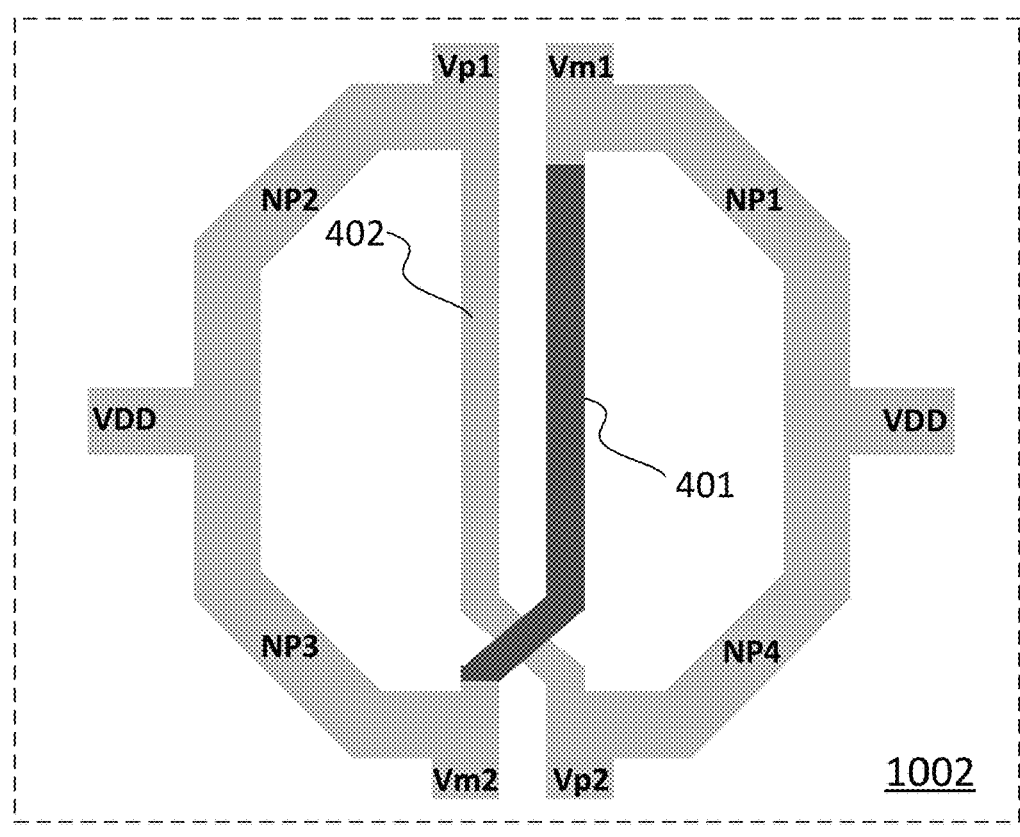
FIG. 10 illustrates a layout of a sixth implementation of the transformer power combiner balancing apparatus shown in FIG. 4 in accordance with various embodiments of the present disclosure.
Figure 10:
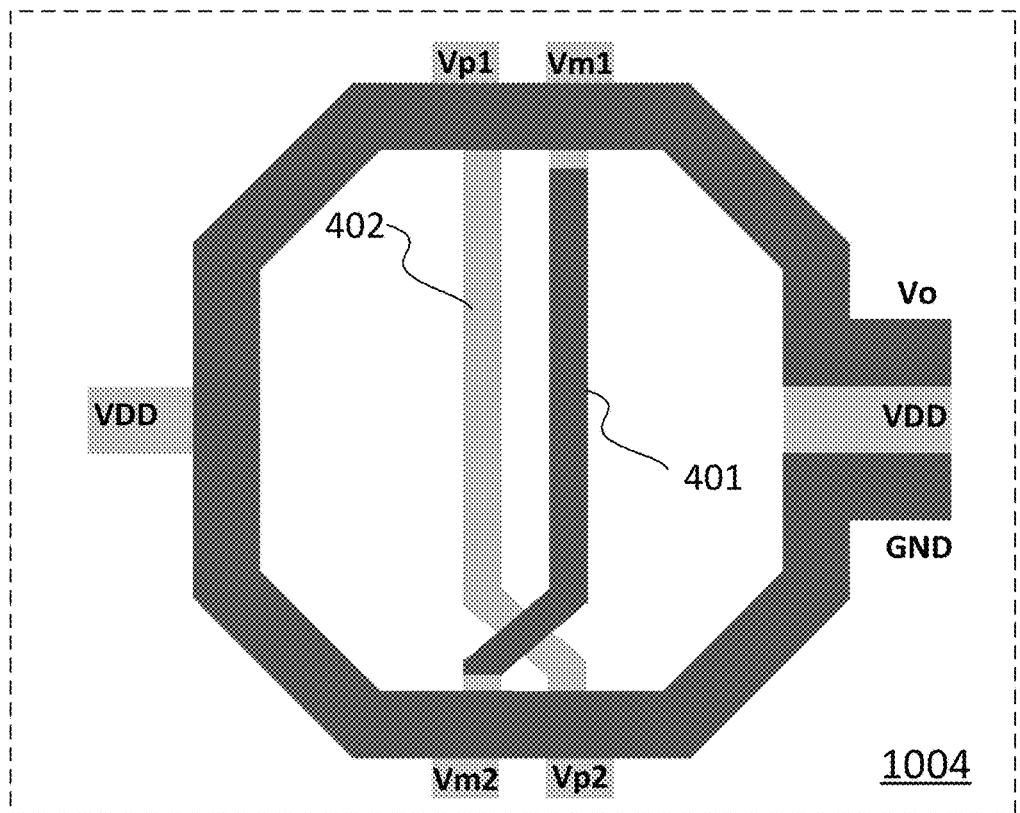

FIG. 10 illustrates a layout of a sixth implementation of the transformer power combiner balancing apparatus shown in FIG. 4 in accordance with various embodiments of the present disclosure. The sixth implementation shown in dashed rectangles 1002 and 1004 is similar to the first implementation shown in FIG. 5 except that the X-shaped crossover is adjacent to Vp2 and Vm2.

As shown in FIG. 10, the first conductive element 401 comprises a first portion connected to the first negative port (Vm1) and a second portion connected to the second negative port (Vm2). The second conductive element 402 comprises a first portion connected to the first positive port (Vp1) and a second portion connected to the second positive port (Vp2). The first portion of the first conductive element 401 is in parallel with the first portion of the second conductive element 402. A portion of the second portion of the first conductive element 401 diagonally crosses over a portion of the second portion of the second conductive element 402.

Figure 11:
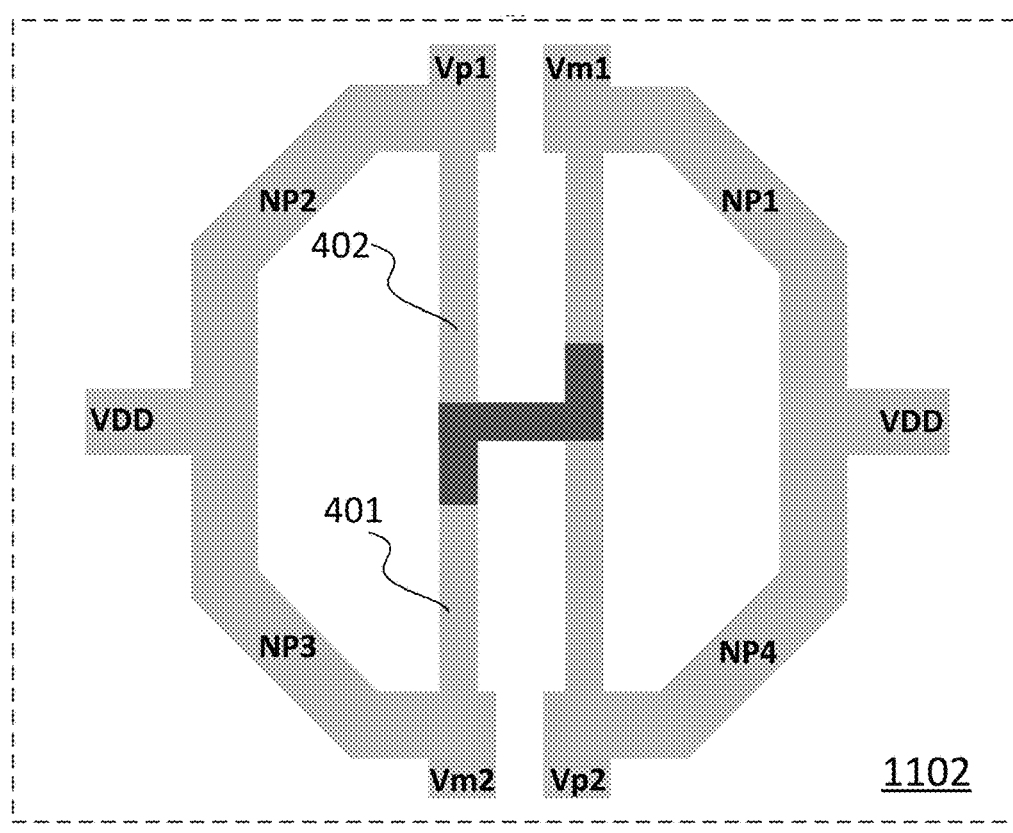
FIG. 11 illustrates a layout of a seventh implementation of the transformer power combiner balancing apparatus shown in FIG. 4 in accordance with various embodiments of the present disclosure.
Figure 11:
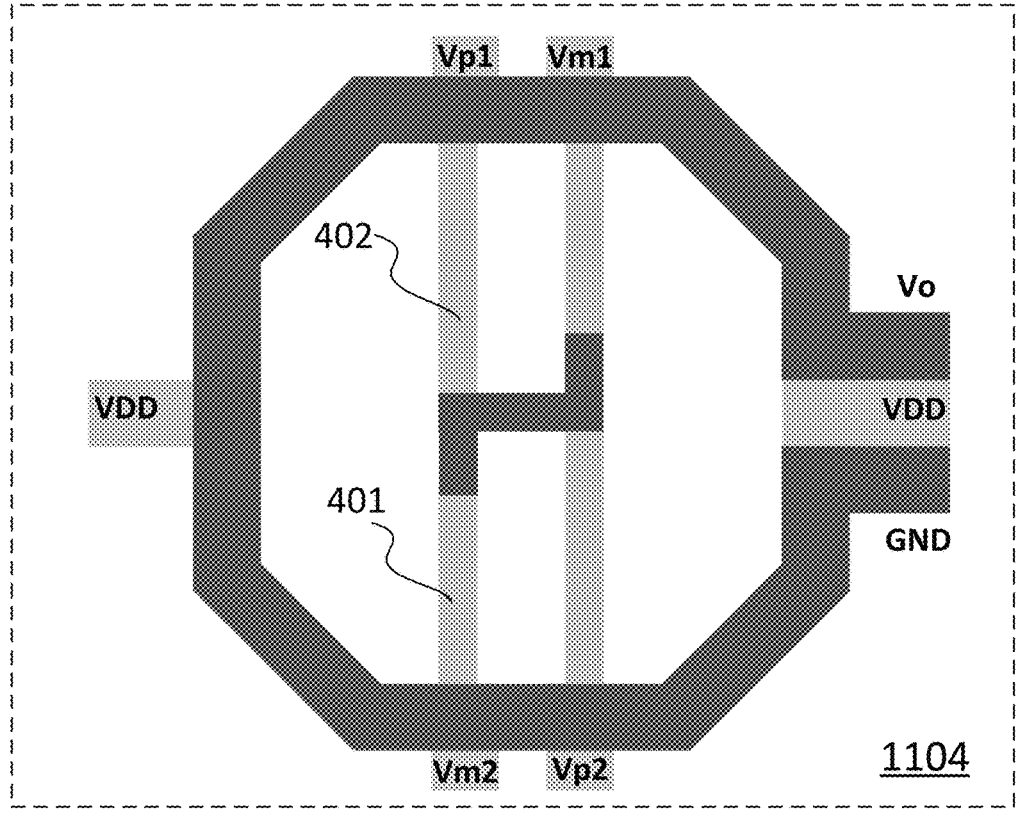

FIG. 11 illustrates a layout of a seventh implementation of the transformer power combiner balancing apparatus shown in FIG. 4 in accordance with various embodiments of the present disclosure. The seventh implementation shown in dashed rectangles 1102 and 1104 is similar to the first implementation shown in FIG. 5 except that the diagonal crossing is replaced by right angle conductors as shown in FIG. 11.

Figure 12:
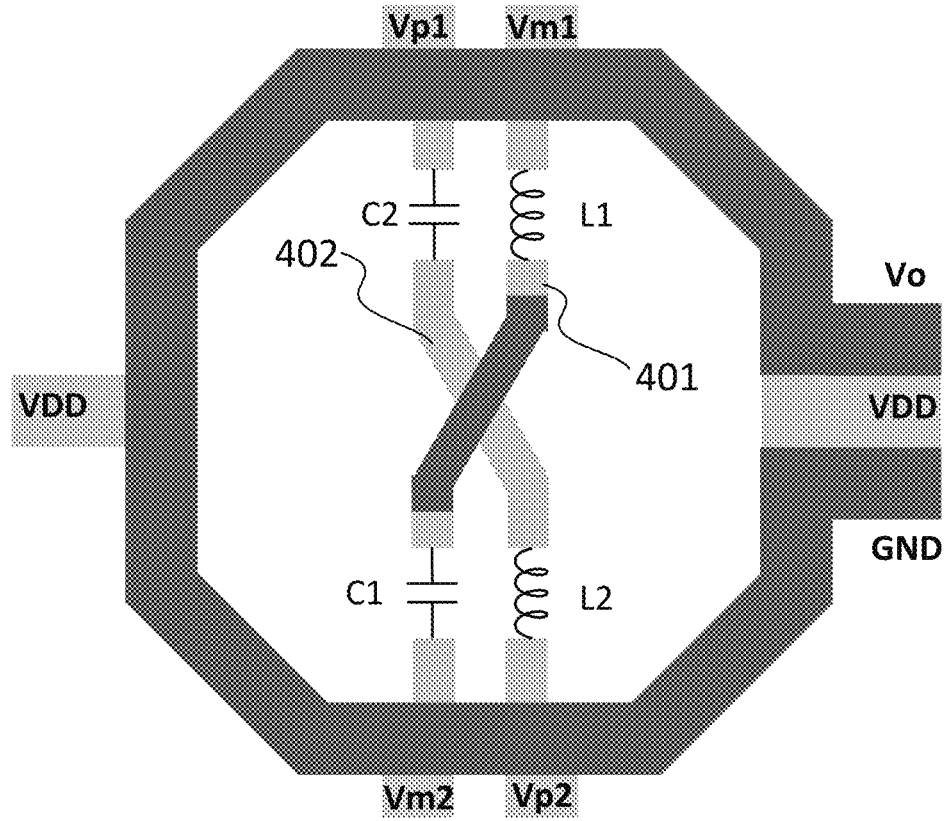
FIG. 12 illustrates a layout of an eighth implementation of the transformer power combiner balancing apparatus shown in FIG. 4 in accordance with various embodiments of the present disclosure.

FIG. 12 illustrates a layout of an eighth implementation of the transformer power combiner balancing apparatus shown in FIG. 4 in accordance with various embodiments of the present disclosure. The eighth implementation shown in FIG. 12 is similar to the first implementation shown in FIG. 5 except that inductive and capacitive elements are included in the transformer power combiner balancing apparatus.

As shown in FIG. 12, the first conductive element 401 comprises a first portion connected to the first negative port (Vm1), a second portion connected to the second negative port (Vm2), and a middle portion connected between the first portion and the second portion of the first conductive element 401. The first portion of the first conductive element 401 comprises a first inductive element L1. The second portion of the first conductive element 401 comprises a first capacitive element C1. In some embodiments, the first inductive element L1 may be an inductor formed by metallization lines over a semiconductor substrate. The first capacitive element C1 may be a capacitor such as a silicon-based capacitor having a metal-insulator-metal structure.

As shown in FIG. 12, the second conductive element 402 comprises a first portion connected to the first positive port (Vp1), a second portion connected to the second positive port (Vp2), and a middle portion connected between the first portion and the second portion of the second conductive element 402. The first portion of the second conductive element 402 comprises a second capacitive element C2. The second portion of the second conductive element 402 comprises a second inductive element L2. In some embodiments, the second inductive element L2 may be an inductor formed by metallization lines over a semiconductor substrate. The second capacitive element C2 may be a capacitor such as a silicon-based capacitor having a metal-insulator-metal structure.

The first portion of the first conductive element 401 is in parallel with the first portion of the second conductive element 402. The second portion of the first conductive element 402 is in parallel with the second portion of the second conductive element 402. The middle portion of the first conductive element 401 and the middle portion of the second conductive element 402 are formed in different metal layers and diagonally cross each other.

In operation, the first inductive element L1 and the first capacitive element C1 are configured such that under an operating frequency, the first conductive element 401 is of a first predetermined impedance. In some embodiments, the first predetermined impedance is equal to zero. The second inductive element L2 and the second capacitive element C2 are configured such that under the operating frequency, the second conductive element 402 is of a second predetermined impedance. In some embodiments, the second predetermined impedance is equal to zero.

Figure 13:
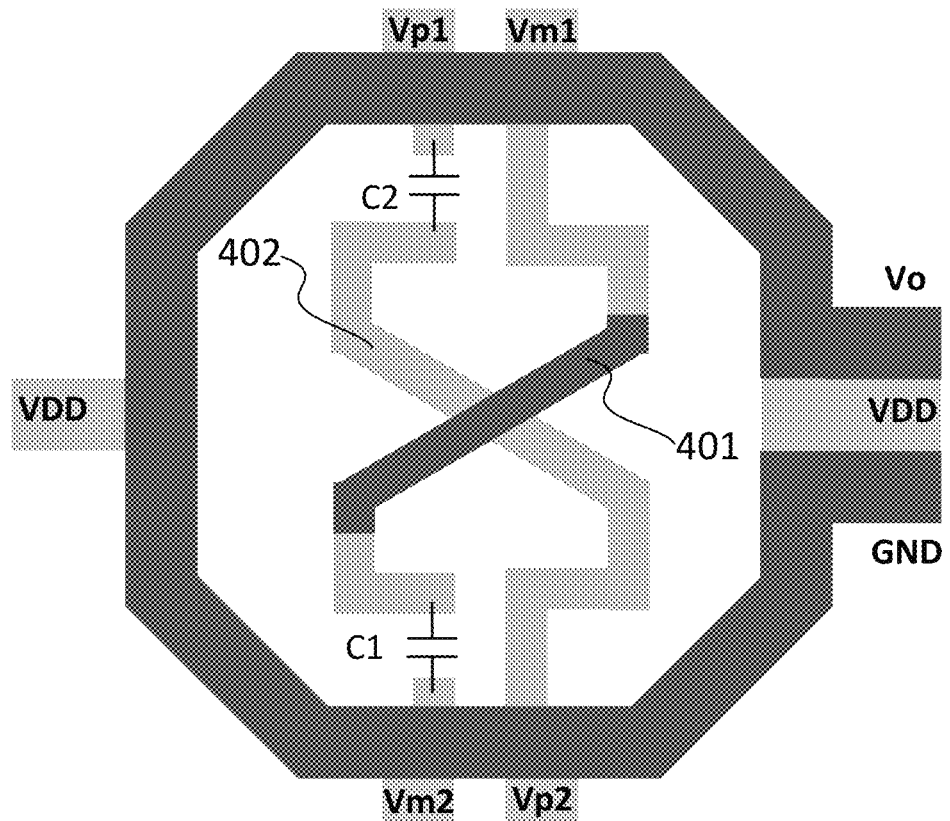
FIG. 13 illustrates a layout of a ninth implementation of the transformer power combiner balancing apparatus shown in FIG. 4 in accordance with various embodiments of the present disclosure.

FIG. 13 illustrates a layout of a ninth implementation of the transformer power combiner balancing apparatus shown in FIG. 4 in accordance with various embodiments of the present disclosure. The ninth implementation shown in FIG. 13 is similar to the eighth implementation shown in FIG. 12 except that the inductance of the conductive element is employed to replace a dedicated inductor. In other words, the inductive elements could be implemented as straight line conductors. Additionally, one way of adding further inductance is to increase the spacing of the wires, effectively forming part of a coil using the cross-connections. As shown in FIG. 13, the conductors of the conductive elements 401 and 402 are spaced apart, to effectively form a pair of differential inductors in an 8-shape.

Figure 14:
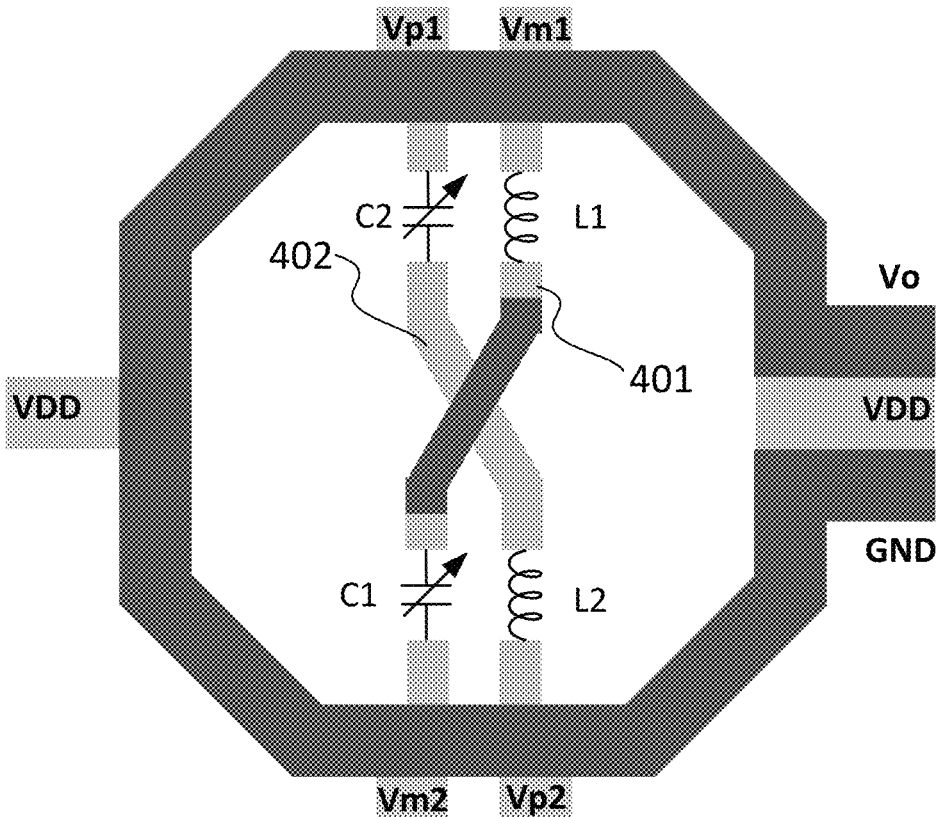
FIG. 14 illustrates a layout of a tenth implementation of the transformer power combiner balancing apparatus shown in FIG. 4 in accordance with various embodiments of the present disclosure.

FIG. 14 illustrates a layout of a tenth implementation of the transformer power combiner balancing apparatus shown in FIG. 4 in accordance with various embodiments of the present disclosure. The tenth implementation shown in FIG. 14 is similar to the eighth implementation shown in FIG. 12 except that C1 and C2 are implemented as adjustable capacitive elements. In operation, the power amplifiers 101 and 102 may operate at different frequencies. The adjustable capacitive elements can be dynamically adjusted so that under different frequencies, the impedances of the first conductive element 401 and the second conductive element 402 remain the same.

Figure 15:
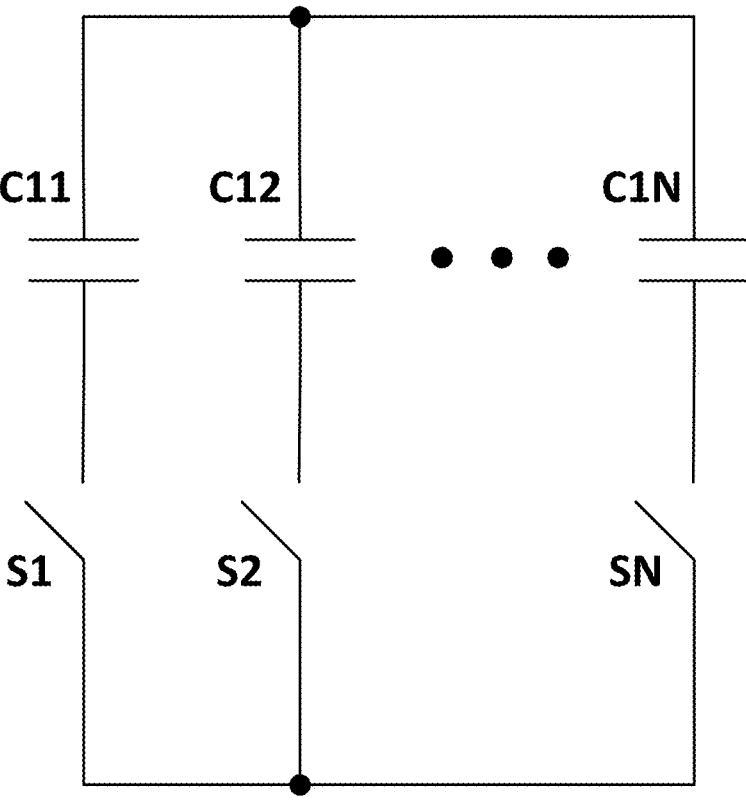
FIG. 15 illustrates a schematic diagram of the adjustable capacitive element shown in FIG. 14 with various embodiments of the present disclosure.

FIG. 15 illustrates a schematic diagram of the adjustable capacitive element shown in FIG. 14 with various embodiments of the present disclosure. The first capacitive element C1 and the second capacitive element C2 are adjustable capacitive elements having the same structure. For simplicity, only the schematic diagram of the first capacitive element C1 is illustrated in FIG. 14. The first capacitive element C1 comprises a plurality of capacitor-switch networks connected in parallel. A first capacitor-switch network comprises C11 and S1 connected in series. A second capacitor-switch network comprises C12 and S2 connected in series. A last capacitor-switch network comprises C1N and SN connected in series. In operation, through controlling the on and off of the switches S1-SN, the capacitance of the first capacitive element C1 varies accordingly.

Figure 16:
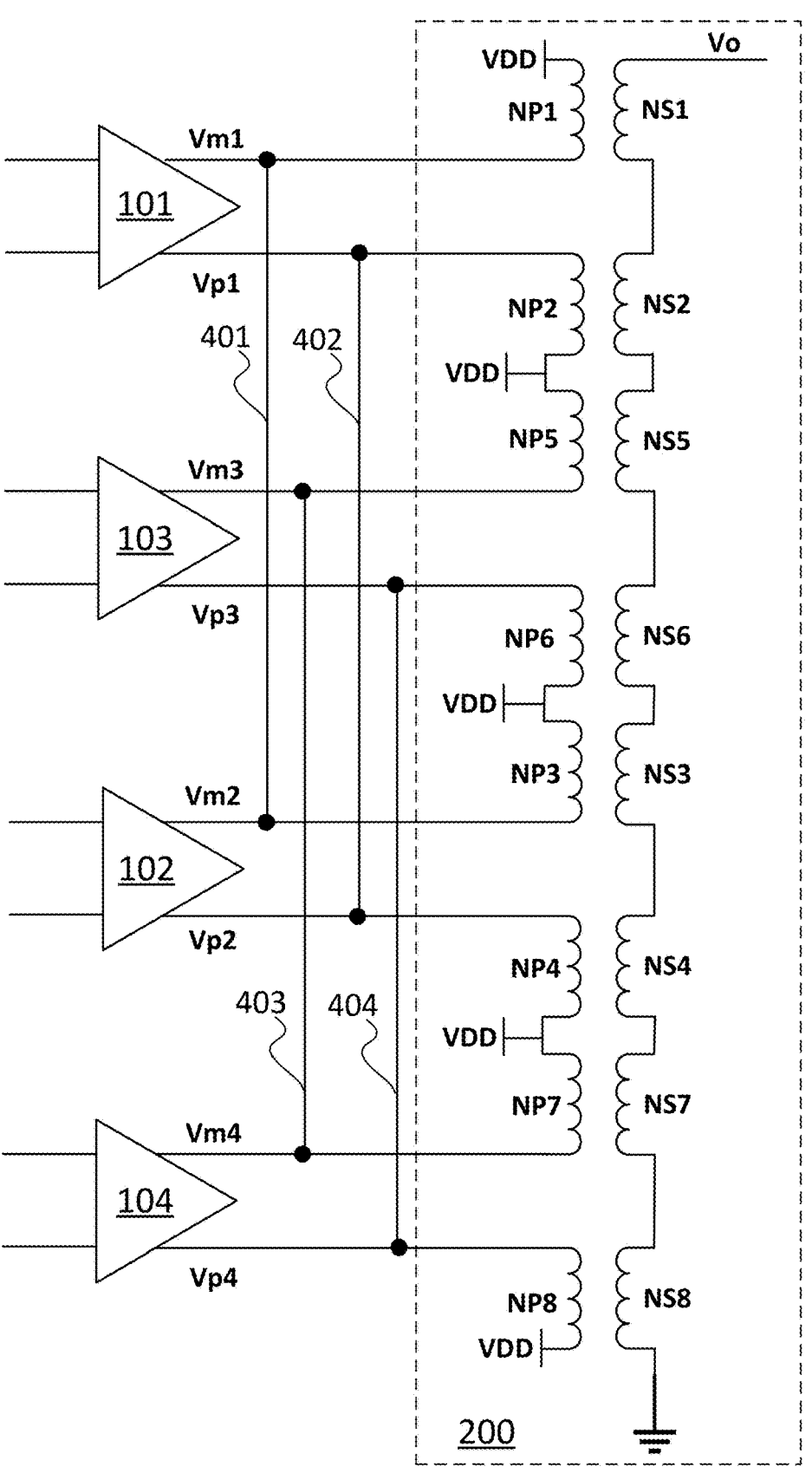
FIG. 16 illustrates a schematic diagram of another transformer power combiner system in accordance with various embodiments of the present disclosure.

FIG. 16 illustrates a schematic diagram of another transformer power combiner system in accordance with various embodiments of the present disclosure. The transformer power combiner system shown in FIG. 16 is similar to that shown in FIG. 4 except that it is a power combiner system having four power amplifiers and four conductive elements. In addition, the transformer power combiner 200 comprises primary windings NP1-NP8, and secondary windings NS1-NS8.

As shown in FIG. 16, the negative output terminal Vm3 of the third power amplifier 103 is coupled to a first terminal of the fifth primary winding NP5. A second terminal of the fifth primary winding NP5 is connected to the predetermined bias voltage VDD. The positive output terminal Vp3 of the third power amplifier 103 is coupled to a first terminal of the sixth primary winding NP6. A second terminal of the sixth primary winding NP6 is connected to the predetermined bias voltage VDD.

The negative output terminal Vm4 of the fourth power amplifier 104 is coupled to a first terminal of the seventh primary winding NP7. A second terminal of the seventh primary winding NP7 is connected to the predetermined bias voltage VDD. The positive output terminal Vp4 of the fourth power amplifier 104 is coupled to a first terminal of the eighth primary winding NP8. A second terminal of the eighth primary winding NP8 is connected to the predetermined bias voltage VDD.

A third conductive element 403 is connected between the negative output terminal Vm3 of the third power amplifier 103 and the negative output terminal Vm4 of the fourth power amplifier 104. A fourth conductive element 404 is connected between the positive output terminal Vp3 of the third power amplifier 103 and the positive output terminal Vp4 of the fourth power amplifier 104.

Figure 17:
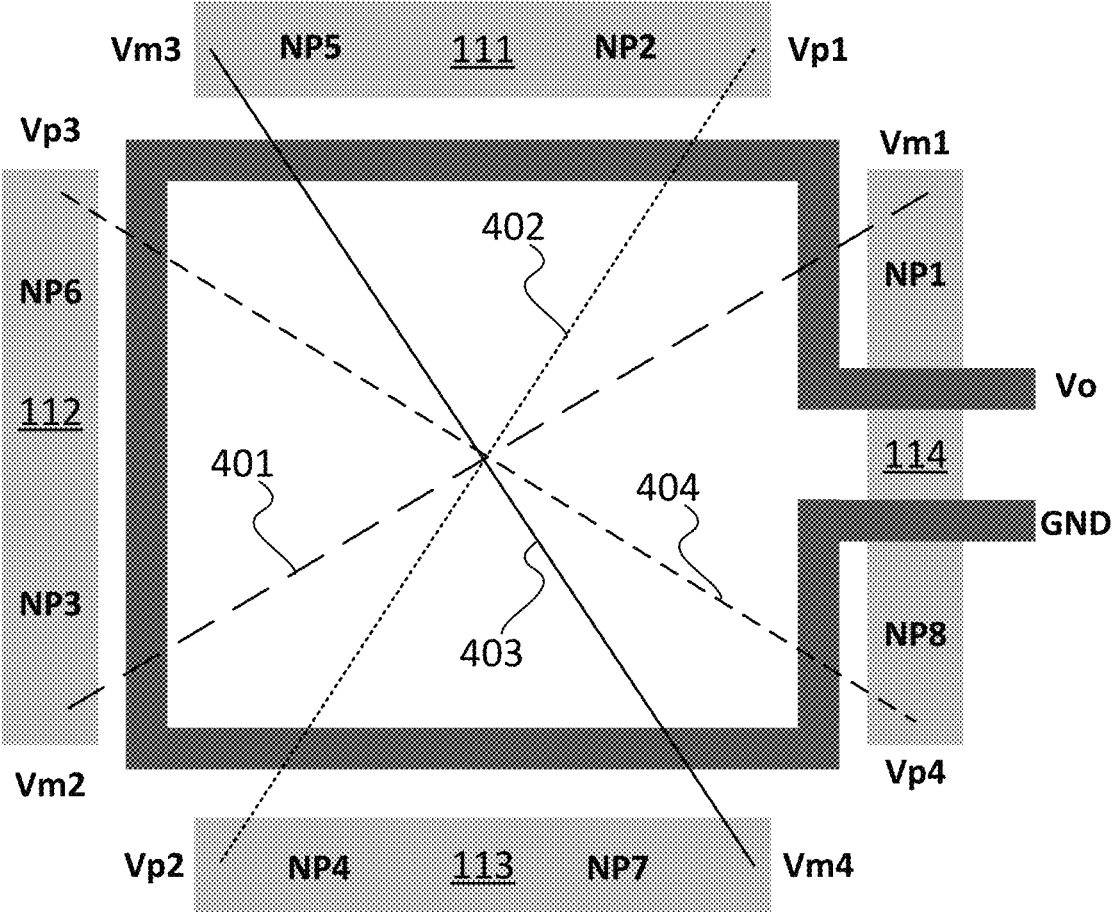
FIG. 17 illustrates a layout of the transformer power combiner balancing apparatus shown in FIG. 15 in accordance with various embodiments of the present disclosure.

FIG. 17 illustrates a layout of the transformer power combiner balancing apparatus shown in FIG. 16 in accordance with various embodiments of the present disclosure. The second primary winding NP2 and the fifth primary winding NP5 are on a first metal slab 111. The sixth primary winding NP6 and the third primary winding NP3 are on a second metal slab 112. The fourth primary winding NP4 and the seventh primary winding NP7 are on a third metal slab 113. The eighth primary winding NP8 and the first primary winding NP1 are on a fourth metal slab 114. As shown in FIG. 17, the first metal slab 111, the second metal slab 112, the third metal slab 113 and the fourth metal slab 114 form a square geometry.

The first conductive element 401 is connected between Vm1 and Vm2. The second conductive element 402 is connected between Vp1 and Vp2. The third conductive element 403 is connected between Vm3 and Vm4. The fourth conductive element is connected between Vp3 and Vp4. As shown in FIG. 17, the first conductive element 401, the second conductive element 402, the third conductive element 403 and the fourth conductive element 404 are symmetric with respect to a center of the square geometry.

Figure 18:
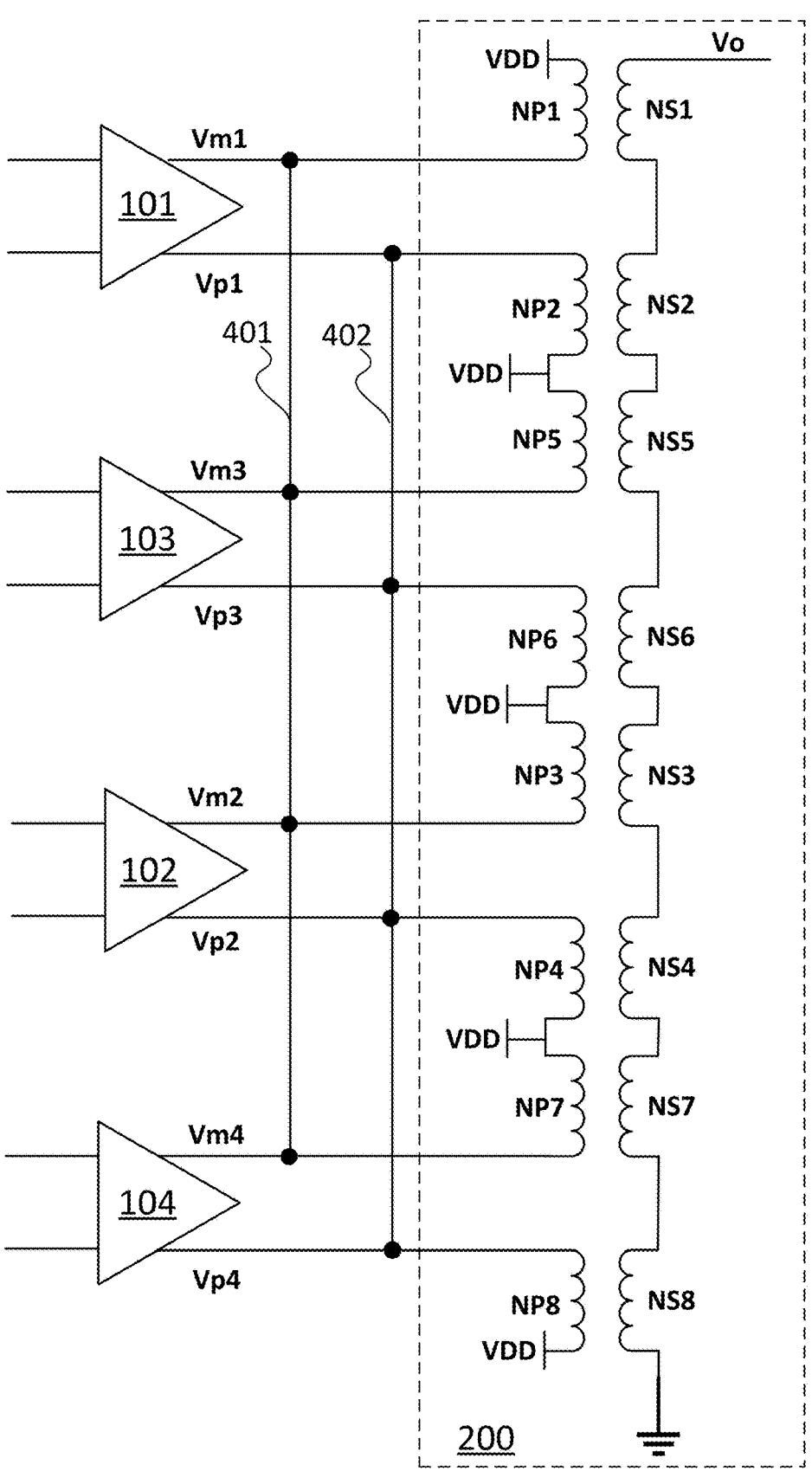
FIG. 18 illustrates a schematic diagram of yet another transformer power combiner system in accordance with various embodiments of the present disclosure.

FIG. 18 illustrates a schematic diagram of yet another transformer power combiner system in accordance with various embodiments of the present disclosure. The transformer power combiner system shown in FIG. 18 is similar to that shown in FIG. 16 except that only two conductive elements are employed in the transformer power combiner system shown in FIG. 18. As shown in FIG. 18, the first conductive element 401 is employed to connect Vm1, Vm2, Vm3 and Vm4 together. The second conductive element 402 is employed to connect Vp1, Vp2, Vp3 and Vp4 together.

Figure 19:
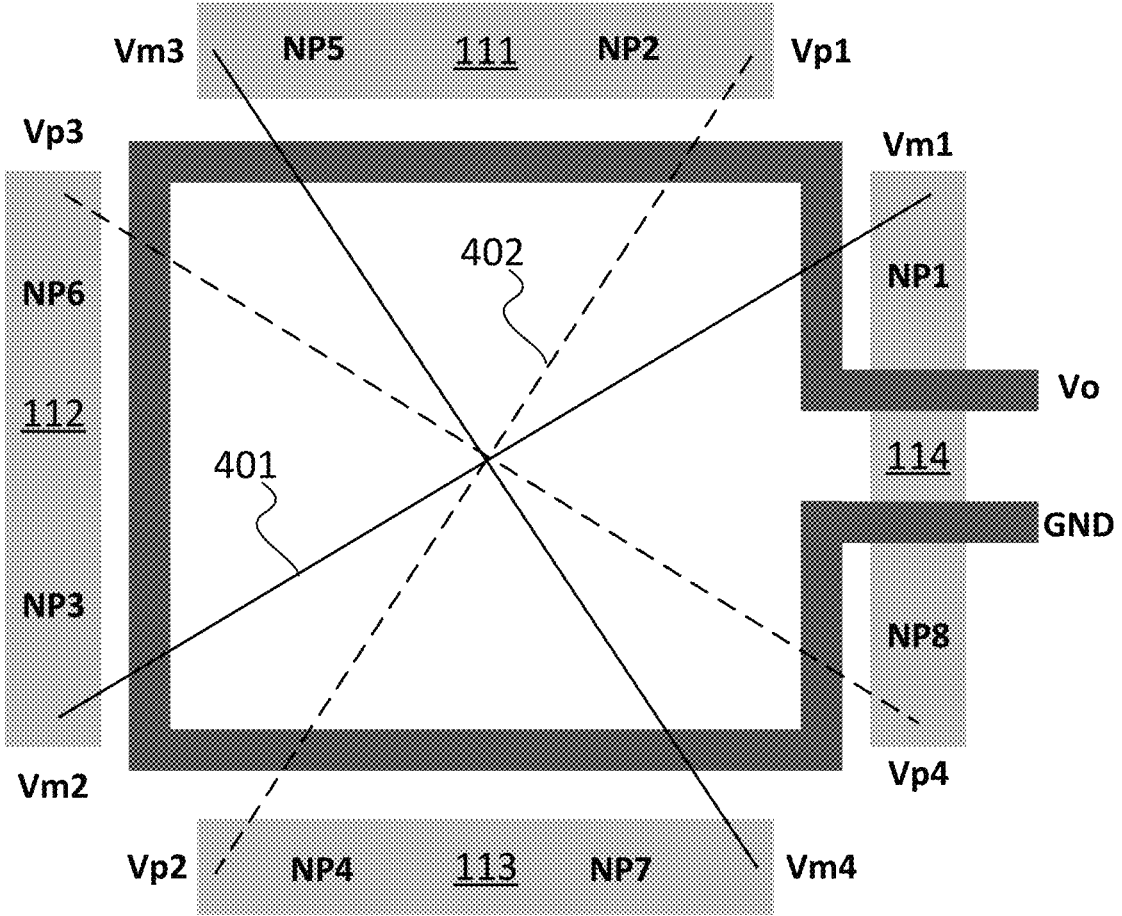
FIG. 19 illustrates a layout of the transformer power combiner balancing apparatus shown in FIG. 18 in accordance with various embodiments of the present disclosure.

FIG. 19 illustrates a layout of the transformer power combiner balancing apparatus shown in FIG. 18 in accordance with various embodiments of the present disclosure. The second primary winding NP2 and the fifth primary winding NP5 are on a first metal slab 111. The sixth primary winding NP6 and the third primary winding NP3 are on a second metal slab 112. The fourth primary winding NP4 and the seventh primary winding NP7 are on a third metal slab 113. The eighth primary winding NP8 and the first primary winding NP1 are on a fourth metal slab 114. As shown in FIG. 15, the first metal slab 111, the second metal slab 112, the third metal slab 113 and the fourth metal slab 114 form a square geometry.

The first conductive element 401 includes two portions. A first portion is connected between Vm1 and Vm2. A second portion is connected between Vm3 and Vm4. The second conductive element 402 includes two portions. A first portion is connected between Vp1 and Vp2. A second portion is connected between Vp3 and Vp4. As shown in FIG. 19, the first conductive element 401 and the second conductive element 402 are symmetric with respect to a center of the square geometry.

FIG. 20 illustrates a flow chart of forming the transformer power combiner system shown in FIG. 4 in accordance with various embodiments of the present disclosure. This flowchart shown in FIG. 20 is merely an example, which should not unduly limit the scope of the claims. One of ordinary skill in the art would recognize many variations, alternatives, and modifications. For example, various steps illustrated in FIG. 20 may be added, removed, replaced, rearranged and repeated.

At step 2002, primary windings of a distributed transformer are formed on a first metal layer. A first primary winding and a second primary winding of the distributed transformer are configured to be coupled to a negative output terminal and a positive output terminal of a first power amplifier respectively. A third primary winding and a fourth primary winding of the distributed transformer are configured to be coupled to a negative output terminal and a positive output terminal of a second power amplifier respectively.

At step 2004, second windings of the distributed transformer are formed on a second metal layer.

At step 2006, a first conductive element is configured to be connected between the negative output terminal of the first power amplifier and the negative output terminal of the second power amplifier.

At step 2008, a second conductive element is configured to be connected between the positive output terminal of the first power amplifier and the positive output terminal of the second power amplifier.

The method further comprises forming a first metal trace comprising the first primary winding and the fourth primary winding of the distributed transformer, wherein the first metal trace extends from a first negative port connected to the negative output terminal of the first power amplifier to a second positive port connected to the positive output terminal of the second power amplifier, forming a second metal trace comprising the second primary winding and the third primary winding of the distributed transformer, wherein the second metal trace extends from a first positive port connected to the positive output terminal of the first power amplifier to a second negative port connected to the negative output terminal of the second power amplifier, and forming a third metal trace comprising a first secondary winding, a second secondary winding, a third secondary winding and a fourth secondary winding of the distributed transformer, wherein the third metal trace extends from a first output port to a second output port of the distributed transformer.

In some embodiments, the first conductive element comprises a first portion connected to the first negative port, a second portion connected to the second negative port, and a middle portion connected between the first portion and the second portion of the first conductive element, and the second conductive element comprises a first portion connected to the first positive port, a second portion connected to the second positive port, and a middle portion connected between the first portion and the second portion of the second conductive element, and wherein the first portion of the first conductive element is in parallel with the first portion of the second conductive element, the second portion of the first conductive element is in parallel with the second portion of the second conductive element, and the middle portion of the first conductive element and the middle portion of the second conductive element are formed in different metal layers and diagonally cross each other.

The method further comprises adding a first inductive element in the first portion of the first conductive element, adding a first capacitive element in the second portion of the first conductive element comprises, adding a second capacitive element in the first portion of the second conductive element, adding a second inductive element in the second portion of the second conductive element, configuring the first inductive element and the first capacitive element such that under an operating frequency, the first conductive element is of a first predetermined impedance, and configuring the second inductive element and the second capacitive element such that under the operating frequency, the second conductive element is of a second predetermined impedance.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first power amplifier having a negative output terminal coupled to a first primary winding of a distributed transformer and a positive output terminal coupled to a second primary winding of the distributed transformer;

a second power amplifier having a negative output terminal coupled to a third primary winding of the distributed transformer and a positive output terminal coupled to a fourth primary winding of the distributed transformer;

a first conductive element connected between the negative output terminal of the first power amplifier and the negative output terminal of the second power amplifier;

a second conductive element connected between the positive output terminal of the first power amplifier and the positive output terminal of the second power amplifier;

a first secondary winding of the distributed transformer magnetically coupled to the first primary winding of the distributed transformer;

a second secondary winding of the distributed transformer magnetically coupled to the second primary winding of the distributed transformer;

a third secondary winding of the distributed transformer magnetically coupled to the third primary winding of the distributed transformer; and a fourth secondary winding of the distributed transformer magnetically coupled to the fourth primary winding of the distributed transformer, wherein the first secondary winding, the second secondary winding, the third secondary winding and the fourth secondary winding of the distributed transformer are connected in series between a first output port and a second output port.

2. The apparatus of claim 1, wherein:

the first primary winding, the second primary winding, the third primary winding and the fourth primary winding of the distributed transformer are formed on a first metal layer; and the first secondary winding, the second secondary winding, the third secondary winding and the fourth secondary winding of the distributed transformer are formed on a second metal layer.

3. The apparatus of claim 2, wherein:

the first primary winding and the fourth primary winding of the distributed transformer form a first metal trace extending from a first negative port connected to the negative output terminal of the first power amplifier, to a second positive port connected to the positive output terminal of the second power amplifier;

the second primary winding and the third primary winding of the distributed transformer form a second metal trace extending from a first positive port connected to the positive output terminal of the first power amplifier, to a second negative port connected to the negative output terminal of the second power amplifier, and wherein the first metal trace and the second metal trace are symmetric with respect to a middle line between the first metal trace and the second metal trace; and the first secondary winding, the second secondary winding, the third secondary winding and the fourth secondary winding of the distributed transformer form a third metal trace extending from the first output port to the second output port.

4. The apparatus of claim 3, wherein:

the first conductive element comprises a first portion connected to the first negative port, a second portion connected to the second negative port, and a middle portion connected between the first portion and the second portion of the first conductive element; and the second conductive element comprises a first portion connected to the first positive port, a second portion connected to the second positive port, and a middle portion connected between the first portion and the second portion of the second conductive element, and wherein:

the first portion of the first conductive element is in parallel with the first portion of the second conductive element;

the second portion of the first conductive element is in parallel with the second portion of the second conductive element; and the middle portion of the first conductive element and the middle portion of the second conductive element are formed in different metal layers and diagonally cross each other.

5. The apparatus of claim 3, wherein:

the first conductive element comprises a first portion connected to the first negative port, a second portion connected to the second negative port, and a middle portion connected between the first portion and the second portion of the first conductive element, and wherein three portions of the first conductive element are formed on two different metal layers; and the second conductive element comprises a first portion connected to the first positive port, a second portion connected to the second positive port, and a middle portion connected between the first portion and the second portion of the second conductive element, and wherein three portions of the second conductive element are formed on the two different metal layers, and wherein:

a portion of the first portion of the first conductive element diagonally crosses over a portion of the first portion of the second conductive element;

a portion of the second portion of the first conductive element diagonally crosses over a portion of the second portion of the second conductive element; and a portion of the middle portion of the first conductive element diagonally crosses over a portion of the middle portion of the second conductive element.

6. The apparatus of claim 3, wherein:

the first conductive element comprises a first portion connected to the first negative port, a second portion connected to the second negative port, and a middle portion connected between the first portion and the second portion of the first conductive element, and wherein three portions of the first conductive element are formed on the second metal layer; and the second conductive element comprises a first portion connected to the first positive port, a second portion connected to the second positive port, and a middle portion connected between the first portion and the second portion of the second conductive element, and wherein three portions of the second conductive element are formed on the first metal layer, and wherein:

a portion of the first portion of the first conductive element diagonally crosses over a portion of the first portion of the second conductive element;

a portion of the second portion of the first conductive element diagonally crosses over a portion of the second portion of the second conductive element; and a portion of the middle portion of the first conductive element diagonally crosses over a portion of the middle portion of the second conductive element.

7. The apparatus of claim 3, wherein:

the first conductive element comprises a first portion connected to the first negative port and a second portion connected to the second negative port; and the second conductive element comprises a first portion connected to the first positive port and a second portion connected to the second positive port, and wherein:

a portion of the first portion of the first conductive element diagonally crosses over a portion of the first portion of the second conductive element; and the second portion of the first conductive element is in parallel with the second portion of the second conductive element.

8. The apparatus of claim 3, wherein:

the first conductive element comprises a first portion connected to the first negative port and a second portion connected to the second negative port; and the second conductive element comprises a first portion connected to the first positive port and a second portion connected to the second positive port, and wherein:

the first portion of the first conductive element is in parallel with the first portion of the second conductive element; and a portion of the second portion of the first conductive element diagonally crosses over a portion of the second portion of the second conductive element.

9. The apparatus of claim 3, wherein:

the first conductive element comprises a first portion connected to the first negative port, a second portion connected to the second negative port, and a middle portion connected between the first portion and the second portion of the first conductive element, and wherein the first portion of the first conductive element comprises a first inductive element, and the second portion of the first conductive element comprises a first capacitive element; and the second conductive element comprises a first portion connected to the first positive port, a second portion connected to the second positive port, and a middle portion connected between the first portion and the second portion of the second conductive element, and wherein the first portion of the second conductive element comprises a second capacitive element, and the second portion of the second conductive element comprises a second inductive element and wherein:

the first portion of the first conductive element is in parallel with the first portion of the second conductive element;

the second portion of the first conductive element is in parallel with the second portion of the second conductive element;

the middle portion of the first conductive element and the middle portion of the second conductive element are formed in different metal layers and diagonally cross each other;

the first inductive element and the first capacitive element are configured such that under an operating frequency, the first conductive element is of a first predetermined impedance; and the second inductive element and the second capacitive element are configured such that under the operating frequency, the second conductive element is of a second predetermined impedance.

10. The apparatus of claim 9, wherein:

the first capacitive element comprises a plurality of first capacitor-switch networks connected in parallel; and the second capacitive element comprises a plurality of second capacitor-switch networks connected in parallel.

11. The apparatus of claim 1, further comprising:

a third power amplifier having a negative output terminal coupled to a fifth primary winding of the distributed transformer and a positive output terminal coupled to a sixth primary winding of the distributed transformer;

a fourth power amplifier having a negative output terminal coupled to a seventh primary winding of the distributed transformer and a positive output terminal coupled to an eighth primary winding of the distributed transformer;

a third conductive element connected between the negative output terminal of the third power amplifier and the negative output terminal of the fourth power amplifier; and a fourth conductive element connected between the positive output terminal of the third power amplifier and the positive output terminal of the fourth power amplifier, wherein:

the second primary winding and the fifth primary winding are on a first metal slab;

the sixth primary winding and the third primary winding are on a second metal slab;

the fourth primary winding and the seventh primary winding are on a third metal slab;

the eighth primary winding and the first primary winding are on a fourth metal slab, and wherein the first metal slab, the second metal slab, the third metal slab and the fourth metal slab form a square geometry; and the first conductive element, the second conductive element, the third conductive element and the fourth conductive element are symmetric with respect to a center of the square geometry.

12. The apparatus of claim 1, further comprising:

a third power amplifier having a negative output terminal coupled to a fifth primary winding of the distributed transformer and a positive output terminal coupled to a sixth primary winding of the distributed transformer;

a fourth power amplifier having a negative output terminal coupled to a seventh primary winding of the distributed transformer and a positive output terminal coupled to an eighth primary winding of the distributed transformer, wherein:

the first conductive element is connected to the negative output terminal of the third power amplifier and the negative output terminal of the fourth power amplifier;

the second conductive element is connected to the positive output terminal of the third power amplifier and the positive output terminal of the fourth power amplifier;

the second primary winding and the fifth primary winding are on a first metal slab;

the sixth primary winding and the third primary winding are on a second metal slab;

the fourth primary winding and the seventh primary winding are on a third metal slab;

the eighth primary winding and the first primary winding are on a fourth metal slab, wherein the first metal slab, the second metal slab, the third metal slab and the fourth metal slab form a square geometry; and the first conductive element and the second conductive element are symmetric with respect to a center of the square geometry.

13. A method comprising:

forming primary windings of a distributed transformer on a first metal layer, wherein a first primary winding and a second primary winding of the distributed transformer are configured to be coupled to a negative output terminal and a positive output terminal of a first power amplifier respectively, and a third primary winding and a fourth primary winding of the distributed transformer are configured to be coupled to a negative output terminal and a positive output terminal of a second power amplifier respectively;

forming second windings of the distributed transformer on a second metal layer;

configuring a first conductive element to be connected between the negative output terminal of the first power amplifier and the negative output terminal of the second power amplifier;

configuring a second conductive element to be connected between the positive output terminal of the first power amplifier and the positive output terminal of the second power amplifier;

forming a first metal trace comprising the first primary winding and the fourth primary winding of the distributed transformer, wherein the first metal trace extends from a first negative port connected to the negative output terminal of the first power amplifier to a second positive port connected to the positive output terminal of the second power amplifier;

forming a second metal trace comprising the second primary winding and the third primary winding of the distributed transformer, wherein the second metal trace extends from a first positive port connected to the positive output terminal of the first power amplifier to a second negative port connected to the negative output terminal of the second power amplifier; and forming a third metal trace comprising a first secondary winding, a second secondary winding, a third secondary winding and a fourth secondary winding of the distributed transformer, wherein the third metal trace extends from a first output port to a second output port of the distributed transformer.

14. The method of claim 13, wherein:

the first conductive element comprises a first portion connected to the first negative port, a second portion connected to the second negative port, and a middle portion connected between the first portion and the second portion of the first conductive element; and the second conductive element comprises a first portion connected to the first positive port, a second portion connected to the second positive port, and a middle portion connected between the first portion and the second portion of the second conductive element, and wherein:

the first portion of the first conductive element is in parallel with the first portion of the second conductive element;

the second portion of the first conductive element is in parallel with the second portion of the second conductive element; and the middle portion of the first conductive element and the middle portion of the second conductive element are formed in different metal layers and diagonally cross each other.

15. The method of claim 14, further comprising:

adding a first inductive element in the first portion of the first conductive element;

adding a first capacitive element in the second portion of the first conductive element;

adding a second capacitive element in the first portion of the second conductive element;

adding a second inductive element in the second portion of the second conductive element;

configuring the first inductive element and the first capacitive element such that under an operating frequency, the first conductive element is of a first predetermined impedance; and configuring the second inductive element and the second capacitive element such that under the operating frequency, the second conductive element is of a second predetermined impedance.

16. A system comprising:

a first power amplifier having a negative output terminal coupled to a first primary winding of a distributed transformer and a positive output terminal coupled to a second primary winding of the distributed transformer;

a second power amplifier having a negative output terminal coupled to a third primary winding of the distributed transformer and a positive output terminal coupled to a fourth primary winding of the distributed transformer;

a first conductive element connected between the negative output terminal of the first power amplifier and the negative output terminal of the second power amplifier;

a second conductive element connected between the positive output terminal of the first power amplifier and the positive output terminal of the second power amplifier;

a first secondary winding of the distributed transformer magnetically coupled to the first primary winding of the distributed transformer;

a second secondary winding of the distributed transformer magnetically coupled to the second primary winding of the distributed transformer;

a third secondary winding of the distributed transformer magnetically coupled to the third primary winding of the distributed transformer; and a fourth secondary winding of the distributed transformer magnetically coupled to the fourth primary winding of the distributed transformer, wherein the first secondary winding, the second secondary winding, the third secondary winding and the fourth secondary winding of the distributed transformer are connected in series between a first output port and a second output port.

17. The system of claim 16, wherein:

the first primary winding, the second primary winding, the third primary winding and the fourth primary winding of the distributed transformer are formed on a first metal layer, and wherein:

the first primary winding and the fourth primary winding of the distributed transformer form a first metal trace extending from a first negative port connected to the negative output terminal of the first power amplifier to a second positive port connected to the positive output terminal of the second power amplifier; and the second primary winding and the third primary winding of the distributed transformer form a second metal trace extending from a first positive port connected to the positive output terminal of the first power amplifier to a second negative port connected to the negative output terminal of the second power amplifier, and wherein the first metal trace and the second metal trace are symmetric with respect to a middle line between the first metal trace and the second metal trace; and the first secondary winding, the second secondary winding, the third secondary winding and the fourth secondary winding of the distributed transformer are formed on a second metal layer, and wherein the first secondary winding, the second secondary winding, the third secondary winding and the fourth secondary winding of the distributed transformer form a third metal trace extending from the first output port to the second output port.

18. The system of claim 17, wherein:

the first conductive element comprises a first portion connected to the first negative port, a second portion connected to the second negative port, and a middle portion connected between the first portion and the second portion of the first conductive element; and the second conductive element comprises a first portion connected to the first positive port, a second portion connected to the second positive port, and a middle portion connected between the first portion and the second portion of the second conductive element, and wherein:

the first portion of the first conductive element is in parallel with the first portion of the second conductive element;

the second portion of the first conductive element is in parallel with the second portion of the second conductive element; and the middle portion of the first conductive element and the middle portion of the second conductive element are formed in different metal layers and diagonally cross each other.

* * * * *